(12) United States Patent
Eom et al.

(10) Patent No.: US 11,189,678 B2
(45) Date of Patent: Nov. 30, 2021

(54) ELECTROLUMINESCENT DISPLAY APPARATUS AND DISPLAY APPARATUS

(71) Applicant: LG Display Co., Ltd., Seoul (KR)

(72) Inventors: HyeSeon Eom, Paju-si (KR); Doohyun Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 85 days.

(21) Appl. No.: 16/696,674

(22) Filed: Nov. 26, 2019

(65) Prior Publication Data

US 2020/0176535 A1  Jun. 4, 2020

(30) Foreign Application Priority Data

Dec. 4, 2018  (KR) .................. 10-2018-0154119

(51) Int. Cl.
*H01L 27/32* (2006.01)
*H01L 27/12* (2006.01)
*H01L 29/786* (2006.01)

(52) U.S. Cl.
CPC ...... *H01L 27/3262* (2013.01); *H01L 27/3265* (2013.01); *H01L 27/3276* (2013.01); *H01L 27/1251* (2013.01); *H01L 27/1255* (2013.01)

(58) Field of Classification Search
CPC .......... H01L 29/78642; H01L 27/3262; H01L 27/1251; H01L 27/3265; H01L 27/1255; H01L 27/3279; H01L 51/057
See application file for complete search history.

(56) References Cited

U.S. PATENT DOCUMENTS

| 8,183,628 | B2 | 5/2012 | Masuoka et al. |
| 2017/0330924 | A1* | 11/2017 | Kim .................. H01L 51/5203 |
| 2018/0331129 | A1 | 11/2018 | Gu |
| 2018/0366492 | A1 | 12/2018 | Zhou |

FOREIGN PATENT DOCUMENTS

| CN | 106125436 A | 11/2016 |
| CN | 108766899 A | 11/2018 |

* cited by examiner

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

An electroluminescent display apparatus can include a driving thin film transistor on a substrate, the driving thin film transistor including a gate electrode, a source electrode, a drain electrode, and an active region; a capacitor electrode facing the gate electrode; a first electrode electrically connected to the source electrode; a light emitting layer on the first electrode; and a second electrode on the light emitting layer, wherein the gate electrode and the capacitor electrode extend in a vertical direction with respect to a surface of the substrate.

20 Claims, 18 Drawing Sheets

ELECTROLUMINESCENT DISPLAY APPARATUS AND DISPLAY APPARATUS

CROSS-REFERENCE TO RELATED APPLICATIONS

This application claims the priority benefit under 35 U.S.C. § 119(a) to Patent Application No. 10-2018-0154119, filed in Republic of Korea on Dec. 4, 2018, all of which are hereby expressly incorporated by reference into the present application.

BACKGROUND

Field of the Invention

The preset disclosure relates to a display apparatus, and more particularly, to an electroluminescent display apparatus.

Discussion of the Related Art

Electroluminescent display apparatuses are apparatuses where a light emitting layer is provided between two electrodes (i.e., an anode electrode and a cathode electrode) and emits light with an electric field generated between the two electrodes, thereby displaying an image.

The light emitting layer can be formed of an organic material or an inorganic material such as a quantum dot. In the light emitting layer, an exciton is generated by a combination of an electron and a hole, and when the exciton is shifted from an excited state to a ground state, light is emitted.

In the electroluminescent display apparatuses, each subpixel includes a light emitting layer. Further, each subpixel includes a driving thin film transistor (TFT) for driving the light emission of the light emitting layer and a capacitor which holds a voltage supplied to the driving TFT during one frame.

In this case, in order to enhance the voltage holding characteristic of each subpixel, a capacity of the capacitor should increase for each subpixel. However, an area of each subpixel should increase for increasing the capacity of the capacitor, and due to this, there is a limitation in realizing an ultra-high resolution in display.

SUMMARY

Accordingly, the present disclosure is directed to providing an electroluminescent display apparatus and a display apparatus that substantially obviate one or more problems due to limitations and disadvantages of the related art.

An aspect of the present disclosure is directed to providing an electroluminescent display apparatus and a display apparatus, in which a capacity of a capacitor increases, and moreover, an ultra-high resolution is realized.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided an electroluminescent display apparatus including a substrate, a driving thin film transistor (TFT) on the substrate, the driving TFT including a gate electrode, a source electrode, a drain electrode, and an active region, a capacitor electrode facing the gate electrode, a first electrode electrically connected to the source electrode, a light emitting layer on the first electrode, and a second electrode on the light emitting layer, wherein the gate electrode and the capacitor electrode extend in a vertical direction with respect to the substrate surface.

In various embodiments, the electroluminescent display apparatus can further include a first insulation layer provided between the gate electrode and the capacitor electrode to extend in the vertical direction with respect to the substrate surface, wherein the gate electrode and the capacitor electrode can face each other with the first insulation layer therebetween.

In various embodiments, the electroluminescent display apparatus can further include a second insulation layer provided between the gate electrode and the active region to extend in the vertical direction with respect to the substrate surface, wherein the gate electrode and the active region can face each other with the second insulation layer therebetween, and the active region can extend in the vertical direction with respect to the substrate surface.

In various embodiments, the drain electrode can extend in the vertical direction with respect to the substrate surface, and an upper end of the drain electrode can contact a lower end of the active region.

In various embodiments, the gate electrode can include a portion extending in a horizontal direction and a portion extending in the vertical direction, with respect to the substrate surface, and the portion extending in the horizontal direction can be provided above the capacitor electrode, and the gate electrode and the capacitor electrode can intersect each other with respect to a plan view, and the portion of the gate electrode extending in the horizontal direction can be provided on the capacitor electrode is provided in a region where the gate electrode and the capacitor electrode intersect each other.

In various embodiments, the gate electrode can include a first portion extending in a first direction, a second portion connected to the first portion to extend in a second direction, a third portion connected to the second portion to extend in a third direction, and a fourth portion connected to the third portion and the first portion to extend in a fourth direction, with respect to a plan view, the capacitor electrode can include a first portion extending in the first direction, a second portion connected to the first portion to extend in the second direction, a third portion connected to the second portion to extend in the third direction, and a fourth portion connected to the third portion and the first portion to extend in the fourth direction, with respect to a plan view, and the first portion of the capacitor electrode can face the first portion of the gate electrode, the second portion of the gate electrode can face the second portion of the capacitor electrode, the third portion of the gate electrode can face the third portion of the capacitor electrode, and the fourth portion of the gate electrode can face the fourth portion of the capacitor electrode.

In various embodiments, the electroluminescent display apparatus can further include a switching TFT on the substrate, the switching TFT including a gate electrode, a source electrode, a drain electrode, and an active region, a sensing TFT on the substrate, the sensing TFT including a gate electrode, a source electrode, a drain electrode, and an active region, a data line connected to the source electrode of the switching TFT, a gate line connected to the gate electrode of the switching TFT, a high power line connected to the drain electrode of the driving TFT, a reference line connected to the drain electrode of the sensing TFT, and a sensing line connected to the gate electrode of the sensing TFT.

In various embodiments, the gate line and the sensing line can be provided on the same layer, the data line, the high power line, and the reference line can be provided on the same layer, and the gate line can be provided upward from the data line.

In various embodiments, the gate line and the sensing line can be provided on the same layer, the data line and the reference line can be provided on the same layer, and the data line and the reference line can be provided upward from the high power line and downward from the gate line and the sensing line.

In various embodiments, an upper surface of one end of the gate electrode of the driving TFT can contact a lower surface of the drain electrode of the switching TFT.

In various embodiments, a side surface of one end of the gate electrode of the driving TFT can contact one side surface of the drain electrode of the switching TFT.

In various embodiments, the electroluminescent display apparatus can further include a bank provided to cover an edge of the first electrode, and a trench provided in the bank, wherein a portion of the light emitting layer is disconnected in the trench.

In various embodiments, the electroluminescent display apparatus can further include a lens array spaced apart from the substrate, and an accommodating case accommodating the substrate and the lens array.

In another aspect of the present disclosure, there is provided an electroluminescent display apparatus including a substrate and a thin film transistor (TFT) including a gate electrode, a source electrode, a drain electrode, and an active region each provided on the substrate, wherein the gate electrode, the source electrode, the drain electrode, and the active region extends in a vertical direction with respect to the substrate surface, and an upper surface of the drain electrode contacts a lower surface of the active region, and a lower surface of the source electrode contacts an upper surface of the active region.

In various embodiments, the electroluminescent display apparatus can further include a second insulation layer provided between the gate electrode and the active region to extend in the vertical direction with respect to the substrate surface, wherein the gate electrode and the active region can face each other with the second insulation layer therebetween.

In various embodiments, the electroluminescent display apparatus can further include a capacitor electrode extending in the vertical direction with respect to the substrate surface, and a first insulation layer provided between the gate electrode and the capacitor electrode to extend in the vertical direction with respect to the substrate surface, wherein the gate electrode and the capacitor electrode can face each other with the first insulation layer therebetween.

In another aspect of the present disclosure, there is provided an electroluminescent display apparatus including a substrate, a switching thin film transistor (TFT) on the substrate, the switching TFT including a first gate electrode, a first source electrode, a first drain electrode, and a first active region, a driving TFT on the substrate, the driving TFT including a second gate electrode, a second source electrode, a second drain electrode, and a second active region, a capacitor electrode facing the second gate electrode, a first electrode electrically connected to the second source electrode, a light emitting layer on the first electrode, and a second electrode on the light emitting layer, wherein the first active region extends in a horizontal direction with respect to the substrate surface, and the second active region extends in a vertical direction with respect to the substrate surface.

In various embodiments, the electroluminescent display apparatus can further include a sensing TFT on the substrate, the sensing TFT including a third gate electrode, a third source electrode, a third drain electrode, and a third active region, wherein the third active region extends in the horizontal direction with respect to the substrate surface.

In various embodiments, the first active region and the third active region can be provided on the same layer, and the second active region can be provided on a layer differing from the first active region and the third active region.

In various embodiments, the first source electrode, the second gate electrode, the capacitor electrode, the second drain electrode, and the third drain electrode can extend in the vertical direction with respect to the substrate surface.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
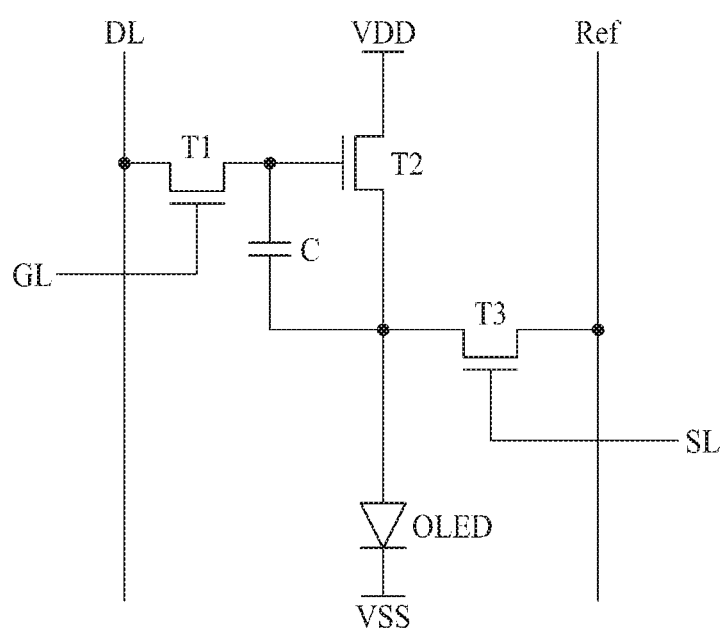
FIG. 1 is a circuit diagram of an electroluminescent display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In construing an element, the element is construed as including an error range although there is no explicit description.

In describing a position relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, exemplary embodiments of the present disclosure will be described in detail with reference to the accompanying drawings.

FIG. 1 is a circuit diagram of an electroluminescent display apparatus according to an embodiment of the present disclosure. All the components of the electroluminescent display apparatus according to all embodiments of the present disclosure are operatively coupled and configured. In FIG. 1, for convenience of description, only one subpixel is illustrated.

As seen in FIG. 1, the electroluminescent display apparatus according to an embodiment of the present disclosure can include a data line DL, a high power line VDD, a reference line Ref, a gate line GL, and a sensing line SL.

The data line DL, the high power line VDD, and the reference line Ref can be spaced apart from one another and can be arranged in a first direction (for example, a lengthwise direction), and the gate line GL and the sensing line SL can be spaced apart from each other and can be arranged in a second direction (for example, a widthwise direction). However, an arrangement structure of the data line DL, the high power line VDD, the reference line Ref, the gate line GL, and the sensing line SL can be changed to various structures known to those skilled in the art.

An individual subpixel of the electroluminescent display apparatus including the lines DL, VDD, Ref, GL, and SL can include a switching thin film transistor (TFT) T1, a driving TFT T2, a sensing TFT T3, a capacitor C, and a light emitting device OLED.

The switching TFT T1 can be turned on according to a gate signal supplied through the gate line GL and can transfer a data voltage, supplied through the data line DL, to the driving TFT T2.

The driving TFT T2 can be turned on with the data voltage supplied through the switching TFT T1, generate a data current from power supplied through the high power line VDD, and supply the data current to the light emitting device OLED.

The sensing TFT T3 can sense a threshold voltage deviation, causing the degradation in image quality, of the driving TFT T2, and in response to a sensing control signal supplied through the sensing line SL, the sensing TFT T3 can transfer a current of the driving TFT T2 to the reference line Ref. In the drawing, an example where the sensing control signal is supplied through the sensing line SL is illustrated, but the present disclosure is not limited thereto. In other embodiments, the present disclosure can be implemented to supply the sensing control signal through the gate line GL, and in this case, the sensing line SL can be omitted.

The capacitor C can hold the data voltage supplied to the driving TFT T2 during one frame and can be connected to a gate electrode and a source electrode of the driving TFT T2. The gate electrode of the driving TFT T2 can be connected to a drain electrode of the switching TFT T1, and the source electrode of the driving TFT T2 can be connected to an anode electrode of the light emitting device OLED. However, the capacitor C can be connected to the gate electrode and the drain electrode of the driving TFT T2.

The light emitting device OLED can emit light with the data current supplied from the driving TFT T2. The light emitting device OLED can include the anode electrode connected to the source electrode of the driving TFT T2 and an organic light emitting layer and a cathode electrode which are sequentially provided on the anode electrode. The cathode electrode of the light emitting device OLED can be connected to a low power line VSS.

Figure 2:
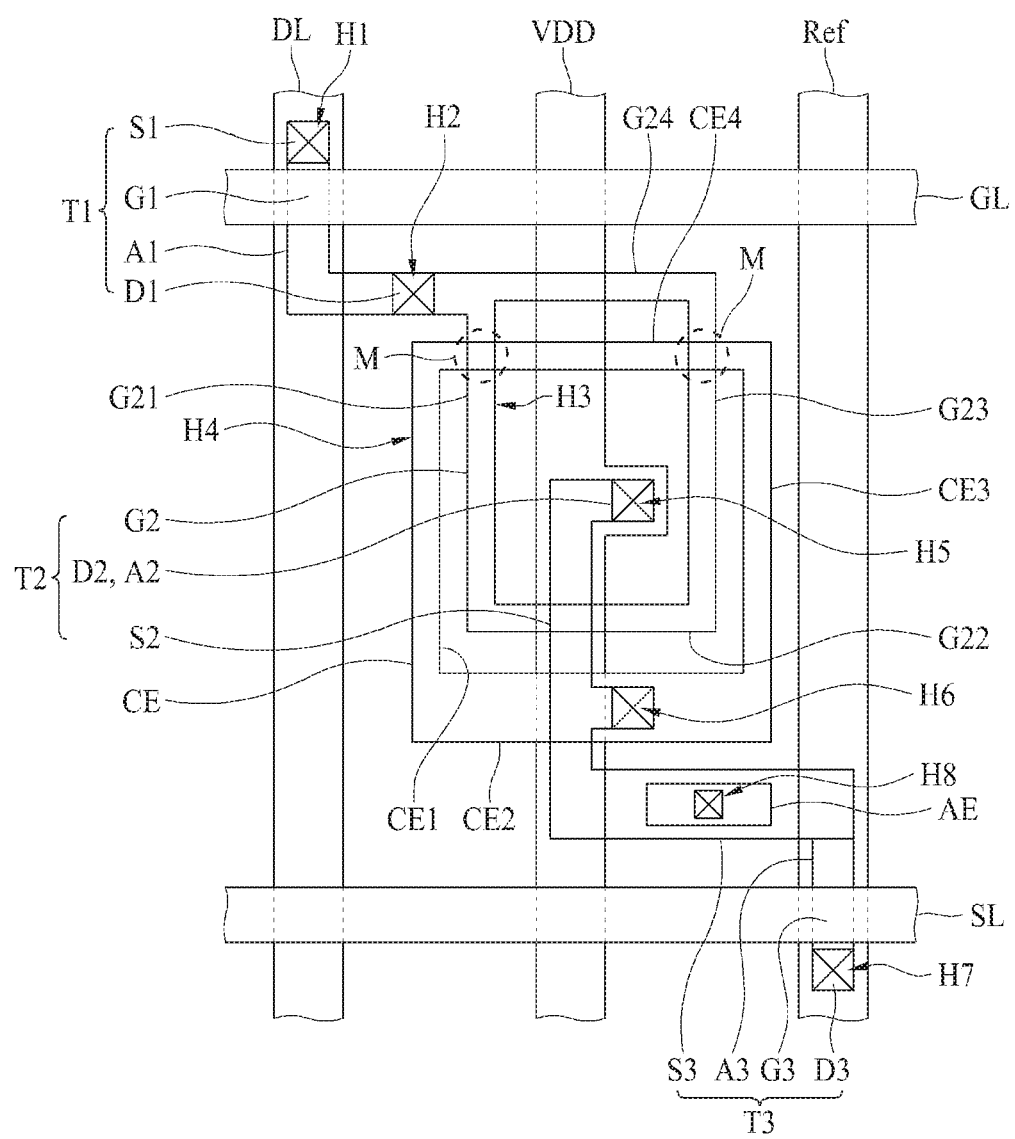
FIG. 2 is a schematic plan view of an electroluminescent display apparatus according to an embodiment of the present disclosure.

FIG. 2 is a schematic plan view of an electroluminescent display apparatus according to an embodiment of the present disclosure.

As seen in FIG. 2, A data line DL, a high power line VDD, and a reference line Ref can be arranged in a first direction (for example, a lengthwise direction), and a gate line GL and a sensing line SL can be arranged in a second direction (for example, a widthwise direction). Also, an individual subpixel of the electroluminescent display apparatus can include a switching TFT T1, a driving TFT T2, and a sensing TFT T3.

The switching TFT T1 can include a first gate electrode G1, a first source electrode S1, a first drain electrode D1, and a first active region A1.

The first gate electrode G1 can be a portion of the gate line GL, and particularly, can be a portion, overlapping the first active region A1, of the gate line GL.

The first source electrode S1 can be connected to one end of the first active region A1 and can be connected to the data line DL through a first hole H1. Particularly, the first source electrode S1 can extend in a vertical direction in the first hole H1 with respect to a cross-sectional view.

The first drain electrode D1 can be connected to the other end of the first active region A1 and can be connected to the second gate electrode G2 of the driving TFT T2 through a second hole H2. Particularly, the first drain electrode D1 can extend in a vertical direction in the second hole H2 with respect to the cross-sectional view.

The first active region A1 can overlap the first gate electrode G1 and can be connected to the first source electrode S1 and the first drain electrode D1. The first active region A1 can be connected to the first source electrode S1 in the first hole H1 region and can be connected to the first drain electrode D1 in the second hole H2 region.

The driving TFT T2 can include a second gate electrode G2, a second source electrode S2, a second drain electrode D2, and a second active region A2.

The second gate electrode G2 can be connected to the first drain electrode of the switching TFT T1. The second gate electrode G2 can include a first portion G21 extending in a first direction, a second portion G22 connected to the first portion G21 to extend in a second direction, a third portion G23 connected to the second portion G22 to extend in a third direction, and a fourth portion G24 connected to the third portion G23 and the first portion G21 to extend in a fourth direction, with respect to a plan view. In this case, the first direction and the third direction can each be a lengthwise direction and can be the same, and the second direction and the fourth direction can each be a widthwise direction and can be the same. Therefore, the second gate electrode G2 can be configured in a tetragonal shape, and in more detail, can be configured in a closed-loop structure having a rectangular shape or a square shape. However, the present disclosure is not limited thereto, and the second gate electrode G2 can be configured in various structures, and for example, can be configured in a closed-loop structure having a polygonal shape, a circular shape, or an oval shape.

The second gate electrode G2 can function as one electrode of a capacitor, and at least a portion of the second gate electrode G2 can extend in a vertical direction along a third hole H3 with respect to a cross-sectional view.

Each of the first portion G21 and the third portion G23 of the second gate electrode G2 can intersect a capacitor electrode CE functioning as another electrode of the capacitor in a region illustrated by M, and thus, can extend in the vertical direction along the third hole H3 with respect to the cross-sectional view in a region other than the region (i.e., a region intersecting the capacitor electrode CE) illustrated by M, so as to prevent short circuit between the second gate electrode G2 and the capacitor electrode CE. The first portion G21 and the third portion G23 of the second gate electrode G2 can be configured to be provided on only the capacitor electrode CE in the region which intersects the capacitor electrode CE and is illustrated by M, and a detailed configuration thereof can be easily understood with reference to a below-described cross-sectional views.

Moreover, the second portion G22 and the fourth portion G24 of the second gate electrode G2 can intersect the high power line VDD without intersecting the capacitor electrode CE, and as seen with respect to the below-described cross-sectional view, since the second gate electrode G2 is provided above, but not in contact with the high power line VDD, there is no possibility that short circuit occurs between the second gate electrode G2 and the high power line VDD. Therefore, all of the second portion G22 and the fourth portion G24 of the second gate electrode G2 can extend in the vertical direction along the third hole H3 with respect to the cross-sectional view. As a result, the third hole H3 can be configured in a polygonal shape, a circular shape, or an oval shape, which is disconnected from the capacitor electrode CE in the region illustrated by M.

The capacitor electrode CE can include a first portion CE1 extending in a first direction, a second portion CE2 connected to the first portion CE1 to extend in a second direction, a third portion CE3 connected to the second portion CE2 to extend in a third direction, and a fourth portion CE4 connected to the third portion CE3 and the first portion CE1 to extend in a fourth direction, with respect to a plan view. In this case, the first direction and the third direction can each be a lengthwise direction and can be the same, and the second direction and the fourth direction can each be a widthwise direction and can be the same. Therefore, the capacitor electrode CE can be configured in a tetragonal shape, and particularly, can be configured in a closed-loop structure having a rectangular shape or a square shape. However, the present disclosure is not limited thereto, and the capacitor electrode CE can be configured in various structures, and for example, can be configured in a closed-loop structure having a polygonal shape, a circular shape, or an oval shape.

The capacitor electrode CE can be configured in a structure corresponding to the second gate electrode G2. Therefore, the first portion CE1 of the capacitor electrode CE can face the first portion G21 of the second gate electrode G2 in parallel, the second portion CE2 of the capacitor electrode CE can face the second portion G22 of the second gate electrode G2 in parallel, the third portion CE3 of the capacitor electrode CE can face the third portion G23 of the second gate electrode G2 in parallel, and the fourth portion CE4 of the capacitor electrode CE can face the fourth portion G24 of the second gate electrode G2 in parallel.

The capacitor electrode CE can extend in a vertical direction along a fourth hole H4 with respect to a cross-sectional view. In detail, all of the first portion CE1, the second portion CE2, the third portion CE3, and the fourth portion CE4 of the capacitor electrode CE can extend along the fourth hole H4 in the vertical direction with respect to the cross-sectional view. Therefore, the fourth hole H4 can be configured in a closed-loop structure having a polygonal shape, a circular shape, or an oval shape. As seen with respect to the below-described cross-sectional view, since the capacitor electrode CE is provided above, but not in contact with, the high power line VDD, the capacitor electrode CE may not be short-circuited with the high power line VDD even when a whole portion of the capacitor electrode CE extends in the vertical direction with respect to the cross-sectional view.

Moreover, the capacitor electrode CE can be connected to the source electrode S2 of the driving TFT T2 and can configure the capacitor along with the second gate electrode G2 of the driving TFT T2. To this end, the capacitor electrode CE can be connected to the source electrode S2 through a sixth hole H6. In this case, the second portion CE2 of the capacitor electrode CE can be connected to the source electrode S2, but is not limited thereto. In other embodiments, by appropriately changing a formation position of the second source electrode S2 or the capacitor electrode CE, the first portion CE1, the third portion CE3, or the fourth portion CE4 of the capacitor electrode CE can be configured to be connected to the second source electrode S2.

By decreasing an interval between the data line DL and the high power line VDD, the data line DL can be provided to overlap the first portion CE1 of the capacitor electrode CE. That is, in FIG. 2, the data line DL can move to the right to overlap the first portion CE1 of the capacitor electrode CE, and in this case, a high-resolution electroluminescent display apparatus can be implemented by reducing a width of each subpixel.

As described above, according to an embodiment of the present disclosure, the gate electrode G2 and the capacitor electrode CE each configuring the capacitor can be configured to extend in a vertical direction with respect to a cross-sectional view, and thus, the capacity of the capacitor can increase in a narrow region with respect to a plan view. Particularly, according to an embodiment of the present disclosure, the second gate electrode G2 can include the first portion G21, the second portion G22, the third portion G23, and the fourth portion G24, and the capacitor electrode CE can include the first portion CE1 facing the first portion G21 of the second gate electrode G2, the second portion CE2 facing the second portion G22 of the second gate electrode G2, the third portion CE3 facing the third portion G23 of the second gate electrode G2, and the fourth portion CE4 facing the fourth portion G24 of the second gate electrode G2, thereby more increasing the capacity of the capacitor.

The second drain electrode D2 can be connected to the high power line VDD through a fifth hole H5. Particularly, the second drain electrode D2 can extend in a vertical direction in the fifth hole H5 with respect to a cross-sectional view.

The second active region A2 can be connected to the second drain electrode D2 and the second source electrode S2. In this case, the second active region A2 can extend in the vertical direction in the fifth hole H5 with respect to the cross-sectional view. In detail, lower end of the second active region A2 can be connected to the second drain electrode D2, and an upper end of the second active region A2 can be connected to the second source electrode S2. With respect to a plan view, a whole portion of the second active region A2 can overlap a whole portion of the second drain electrode D2.

The second source electrode S2 can be connected to the upper end of the second active region A2 and can be connected to the third source electrode S3 to extend in a direction toward the third source electrode S3 of the sensing transistor T3. Also, the second source electrode S2 can be connected to the capacitor electrode CE through the sixth hole H6. Also, the second source electrode S3 can be connected to an auxiliary electrode AE through an eighth hole H8. As seen in the below-described cross-sectional view, the auxiliary electrode AE can connect the second source electrode S2 to the first electrode which functions as an anode electrode.

The sensing TFT T3 can include a third gate electrode G3, a third source electrode S3, a third drain electrode D3, and a third active region A3.

The third gate electrode G3 can be a portion of the sensing line SL, and particularly, can be a portion, overlapping the third active region A3, of the sensing line SL.

The third source electrode S3 can be connected to the second source electrode S2 of the driving TFT T2. The third source electrode S3 can be provided as one body with the second source electrode S2. Also, the third source electrode S3 can be connected to one end of the third active region A3.

The third drain electrode D3 can be connected to the reference line Ref through a seventh hole H7. Particularly, the third drain electrode D3 can extend in a vertical direction in the seventh hole H7 with respect to a cross-sectional view.

The third active region A3 can be connected to the third source electrode S3 and the third drain electrode D3 to overlap the third gate electrode G3. The third active region A3 can be connected to the third drain electrode D3 in the seventh hole H7 region.

Figure 3:
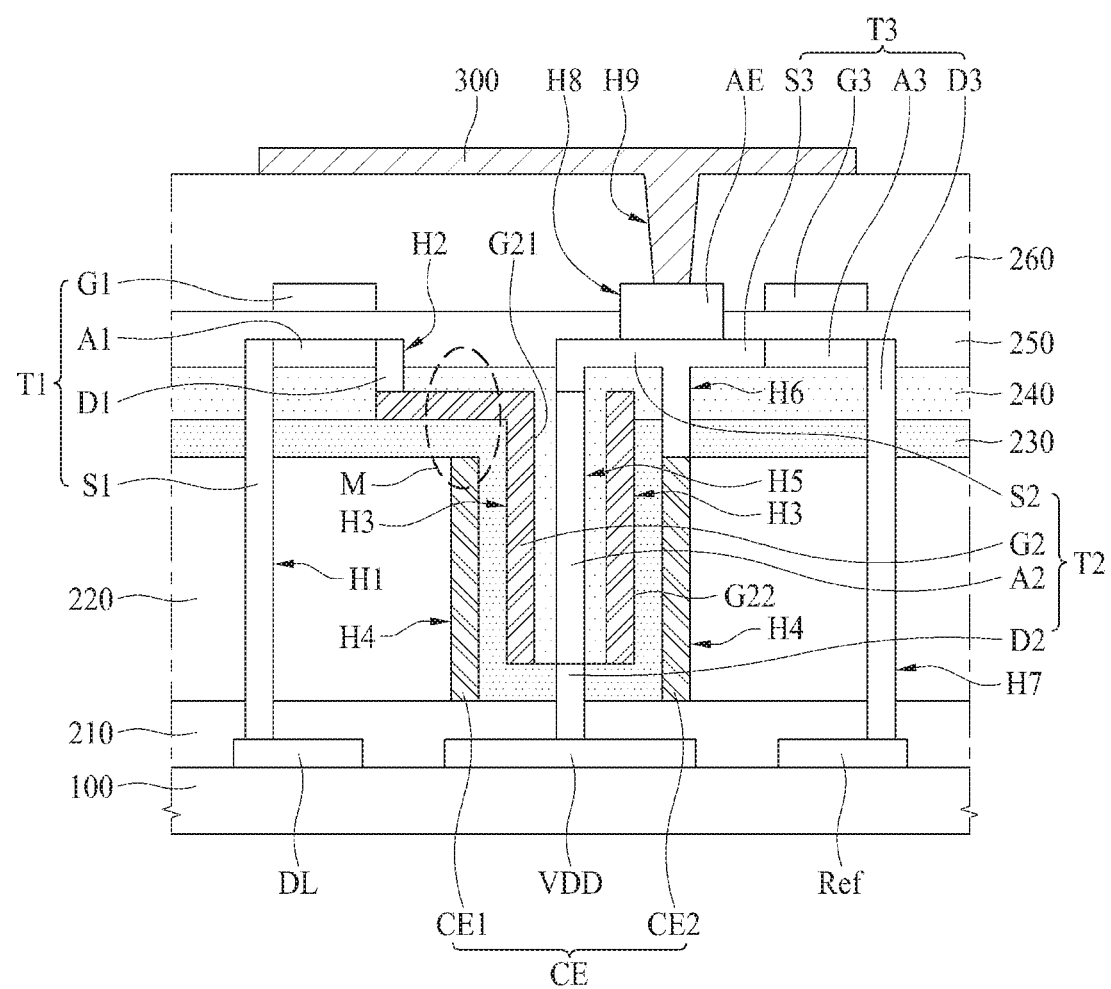
FIG. 3 is a schematic cross-sectional view of an electroluminescent display apparatus according to an embodiment of the present disclosure.

FIG. 3 is a schematic cross-sectional view of an electroluminescent display apparatus according to an embodiment of the present disclosure.

As seen in FIG. 3, the electroluminescent display apparatus according to an embodiment of the present disclosure can include a substrate 100, a data line DL, a high power line VDD, a reference line Ref, a switching TFT T1, a driving TFT T2, a sensing TFT T3, a capacitor electrode CE, an auxiliary electrode AE, a lower insulation layer 210, a middle insulation layer 220, first to fourth insulation layers 230 to 260, and a first electrode 300.

The substrate 100 can be formed of glass or plastic, but is not limited thereto and can be formed of a semiconductor material such as a silicon wafer. The substrate 100 can be formed of a transparent material or an opaque material. The electroluminescent display apparatus according to an embodiment of the present disclosure can be implemented as a top emission type where emitted light is discharged to an upper portion. Accordingly, a material of the substrate 100 can use an opaque material as well as a transparent material.

The data line DL, the high power line VDD, and the reference line Ref can be spaced apart from one another by a certain interval on the substrate 100.

The switching TFT T1 can include a first gate electrode G1, a first source electrode S1, a first drain electrode D1, and a first active region A1.

The first gate electrode G1 can be provided on the third insulation layer 250. As described above, the first gate electrode G1 can be a portion of the gate line GL, and thus, the gate line GL can also be provided on the third insulation layer 250.

The first source electrode S1 can be provided in a first hole H1 passing through the lower insulation layer 210, the middle insulation layer 220, the first insulation layer 230, and the second insulation layer 240, and particularly, can extend in a vertical direction with respect to the substrate 100 surface. Herein, a vertical direction can denote a direction vertical to the substrate 100 surface, and a horizontal direction can denote a direction parallel to the substrate 100 surface.

A lower end of the first source electrode S1 can be connected to the data line DL, and an upper end of the first source electrode S1 can be connected to the first active region A1.

The first drain electrode D1 can extend in a vertical direction in a second hole H2 provided in the second insulation layer 240. A lower end of the first drain electrode D1 can be connected to a second gate electrode G2 of the driving TFT T2, and an upper end of the first drain electrode D1 can be connected to the first active region A1.

The first active region A1 can be connected to the first source electrode S1 and the first drain electrode D1 to overlap the first gate electrode G1. The first active region A1 can extend in a horizontal direction on the second insulation layer 240.

The driving TFT T2 can include the second gate electrode G2, a second source electrode S2, a second drain electrode D2, and a second active region A2.

The second gate electrode G2 can include a first portion G21 connected to the first drain electrode D1 of the switching TFT T1 in the second hole H2 region. A portion of the first portion G21 can extend in a horizontal direction with respect to the substrate 100 surface, and the other portion of the first portion G21 can extend in a vertical direction with respect to the substrate 100 surface.

A portion of the first portion G21 extending in the horizontal direction can be disposed upward from the capacitor electrodes CE1 and CE2 with the first insulation layer 230 therebetween and can be located in the region illustrated by M of FIG. 2. The other portion of the first portion G21 extending in the vertical direction can be provided in a third hole H3 provided between the first insulation layer 230 and the second insulation layer 240.

The second gate electrode G2 can include a second portion G22 extending in a vertical direction in a third hole H3 provided between the first insulation layer 230 and the second insulation layer 240, similarly to the other portion of the first portion G21 extending in the vertical direction. For convenience, it is illustrated that the second portion G22 is spaced apart from the first portion G21, but as in FIG. 2, the second portion G22 can be connected to the first portion G21. The second gate electrode G2 can further include a third portion G23 extending in a horizontal direction and a vertical direction similarly to the first portion G21 and a fourth portion G24 extending in a vertical direction similarly to the second portion G22.

The second drain electrode D2 can extend in a vertical direction in a fifth hole H5 which is provided in the lower insulation layer 210, the first insulation layer 230, and the second insulation layer 240. A lower end of the second drain electrode D2 can be connected to the high power line VDD, and an upper end of the second drain electrode D2 can be connected to the second active region A2.

The second active region A2 can be connected to the second source electrode S2 and the second drain electrode D2 to face the second gate electrode G2. The second active region A2 can extend in a vertical direction in the fifth hole H5, a lower end of the second active region A2 can be connected to the second drain electrode D2, and an upper end of the second active region A2 can be connected to the second source electrode S2. Particularly, the second active region A2 and the second drain electrode D2 can be provided in the fifth hole H5, and thus, can have the same width and can overlap each other.

The second source electrode S2 can be provided in the fifth hole H5 and can be connected to the second active region A2. Also, the second source electrode S2 can extend in a horizontal direction on the second insulation layer 240 and can be connected to a third source electrode S3 of the sensing TFT T3. Also, the second source electrode S2 can extend in a vertical direction in a sixth hole H6 provided in the third and second insulation layers 230 and 240 and can be connected to a second portion CE2 of the capacitor electrode CE. Also, the second source electrode S2 can be connected to the auxiliary electrode AE through an eighth hole H8 provided in the third insulation layer 250.

The sensing TFT T3 can include a third gate electrode G3, the third source electrode S3, a third drain electrode D3, and a third active region A3.

The third gate electrode G3 can be provided on the third insulation layer 250. As described above, the third gate electrode G3 can be a portion of the sensing line SL, and thus, the sensing line SL can also be provided on the third insulation layer 250.

The third source electrode S3 can be connected to the second source electrode S2 and the third active region A3 on the second insulation layer 240. Left one end of the third source electrode S3 can be connected to the second source electrode S2, and the right other end of the third source electrode S3 can be connected to the third active region A3.

The third drain electrode D3 can extend in a vertical direction in a seventh hole H7 which is provided to pass through the lower insulation layer 210, the middle insulation layer 220, the first insulation layer 230, and the second insulation layer 240. A lower end of the third drain electrode D3 can be connected to the reference line Ref, and an upper end of the third drain electrode D3 can be connected to the third active region A3.

The third active region A3 can be connected to the third source electrode S3 and the third drain electrode D3 to overlap the third gate electrode G3. The third active region A3 can extend in a horizontal direction on the second insulation layer 240.

The capacitor electrode CE can include a first portion CE1 and the second portion CE2 which extend in a vertical direction in a fourth hole H4 provided between the middle insulation layer 220 and the first insulation layer 230. The first portion CE1 of the capacitor electrode CE can face the first portion G21 of the second gate electrode G2 to configure a capacitor, and the second portion CE2 of the capacitor electrode CE can face the second portion G22 of the second gate electrode G2 to configure a capacitor. For convenience, it is illustrated that the second portion CE2 is spaced apart from the first portion CE1, but as described above with reference to FIG. 2, the second portion CE2 can be connected to the first portion CE1. The second portion CE2 of the capacitor electrode CE can be connected to the second source electrode S2 in the sixth hole H6 overlapping the fourth hole H4.

The capacitor electrode CE can include a third portion CE3 and a fourth portion CE4 which extend in the vertical direction in the fourth hole H4. The third portion CE3 of the capacitor electrode CE can face the third portion G23 of the second gate electrode G2 to configure a capacitor, and the fourth portion CE4 of the capacitor electrode CE can face the fourth portion G24 of the second gate electrode G2 to configure a capacitor.

The auxiliary electrode AE can be connected to the second source electrode S2 through the eighth hole H8 and can be connected to the first electrode 300 capable of functioning as an anode electrode through a ninth hole H9 which is provided to pass through the fourth insulation layer 260.

The lower insulation layer 210 can be provided on the substrate 100, and the middle insulation layer 220 can be provided on the lower insulation layer 210. The middle insulation layer 220 can include an open area provided in a region overlapping the high power line VDD, and the capacitor electrode CE, the second gate electrode G2, the second drain electrode D2, and the second active region A2 can be provided in the open area.

The first insulation layer 230 can be provided on the middle insulation layer 220. The first insulation layer 230 can be provided in the open area of the middle insulation layer 220, and thus, can contact an upper surface of the lower insulation layer 210 in the open area. Also, the first insulation layer 230 can be provided in a vertical direction between the capacitor electrode CE and the second gate electrode G2 in the open area of the middle insulation layer 220.

The second insulation layer 240 can be provided on the first insulation layer 230. The second insulation layer 240 can be provided in the open area of the middle insulation layer 220 and can be provided in a vertical direction between the second gate electrode G2 and the second active region A2 in the open area.

The third insulation layer 250 can be provided on the second insulation layer 240, and the fourth insulation layer 260 can be provided on the third insulation layer 250.

The middle insulation layer 220 can be formed of an organic insulating material having a relatively thick thickness so that the capacitor electrode CE, the second gate electrode G2, and the second active region A2 extend in a vertical direction to each have a certain length in the open area of the middle insulation layer 220. Also, the fourth insulation layer 260 can be formed of an organic insulating material having a relatively thick thickness so as to planarize a surface on the substrate 100, but is not limited thereto. On the other hand, the lower insulation layer 210, the first insulation layer 230, the second insulation layer 240, and the third insulation layer 250 can be formed of an inorganic insulating material having a relatively thin thickness, but are not limited thereto.

The first electrode 300 can be provided on the fourth insulation layer 260 and can be connected to the auxiliary electrode AE through the ninth hole H9. Therefore, the first electrode 300 can be connected to the second source electrode S2 of the driving TFT T2 through the auxiliary electrode AE.

FIGS. 4A to 4K are schematic manufacturing process cross-sectional views of an electroluminescent display apparatus according to an embodiment of the present disclosure and relate to a process of manufacturing the electroluminescent display apparatus of FIG. 3.

Figure 4A:
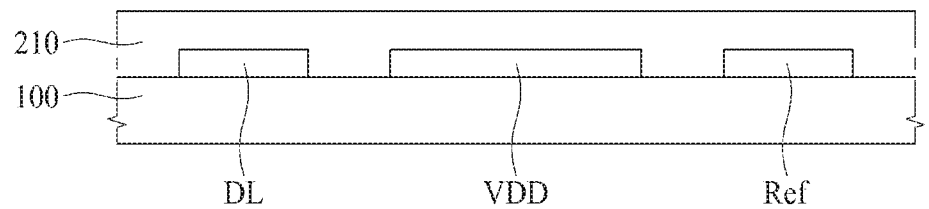
FIGS. 4A to 4K are schematic manufacturing process cross-sectional views of an electroluminescent display apparatus according to an embodiment of the present disclosure.

First, as seen in FIG. 4A, a data line DL, a high power line VDD, and a reference line Ref can be patterned on a substrate 400, and a lower insulation layer 210 can be formed thereon.

Figure 4B:
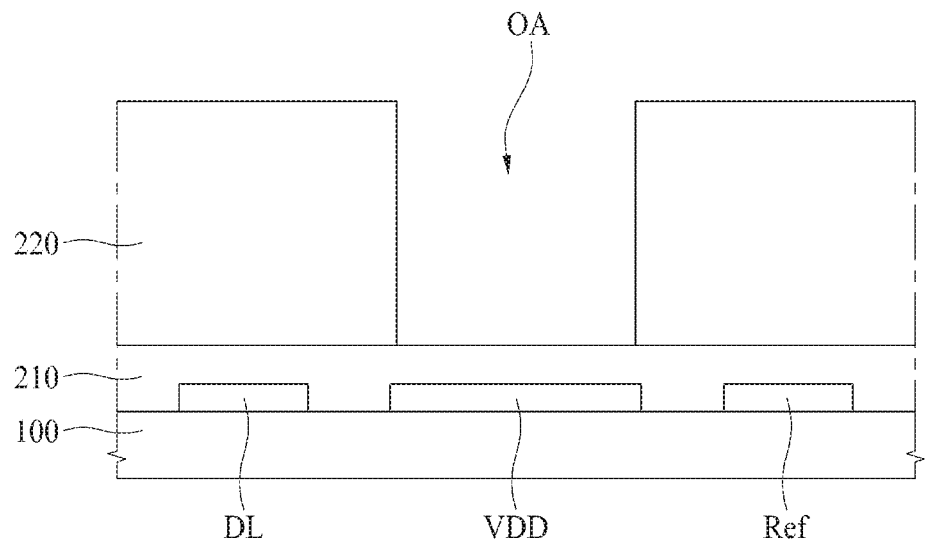

Subsequently, as seen in FIG. 4B, a middle insulation layer 220 can be formed on the lower insulation layer 210, and an open area OA can be formed by removing a portion, overlapping the high power line VDD, of the middle insulation layer 220.

Figure 4C:
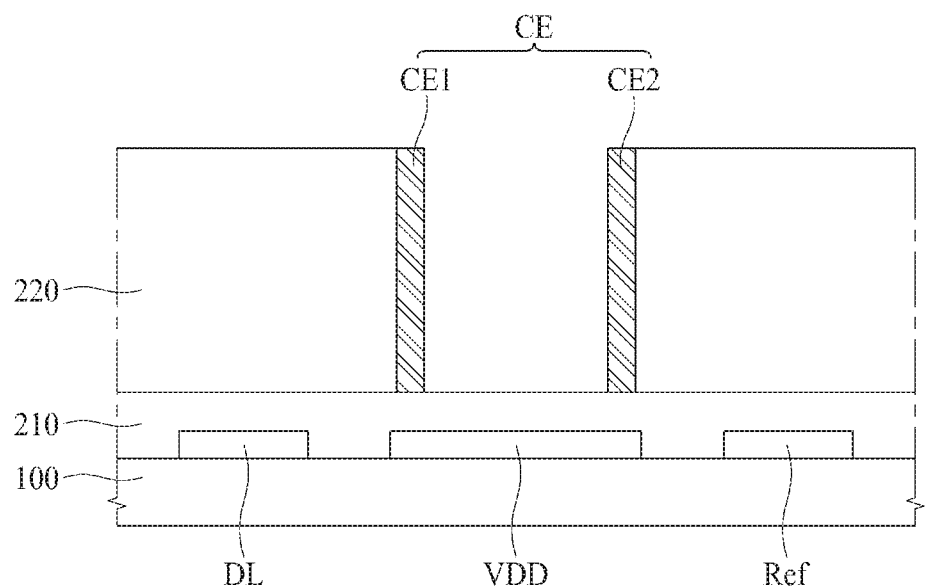

Subsequently, as seen in FIG. 4C, a first portion CE1 and a second portion CE2 of the capacitor electrode CE can be formed on a side surface of the middle insulation layer 220 in the open area OA.

Figure 4D:
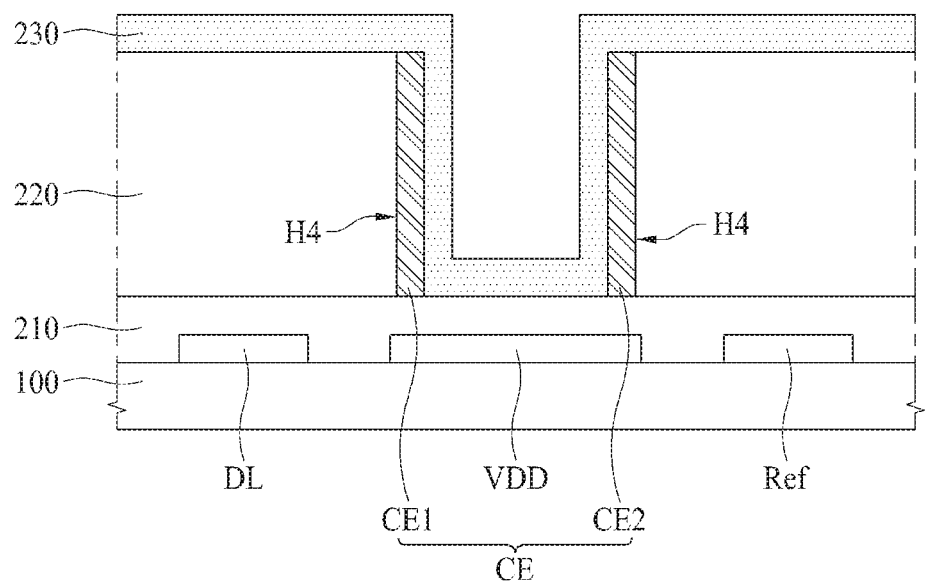

Subsequently, as seen in FIG. 4D, a first insulation layer 230 can be formed on the middle insulation layer 220 and the first portion CE1 and the second portion CE2 of the capacitor electrode CE.

Although the first insulation layer 230 is formed in the open area OA, the first insulation layer 230 can be formed not to fully fill the open area OA. Therefore, the first insulation layer 230 can extend from an upper surface of the middle insulation layer 220 to an upper surface of the lower insulation layer 210 along a side surface of each of the first portion CE1 and the second portion CE2 of the capacitor electrode CE.

Since the first insulation layer 230 is formed, the first portion CE1 and the second portion CE2 of the capacitor electrode CE can extend in a vertical direction in a fourth hole H4 between the middle insulation layer 220 and the first insulation layer 230.

Figure 4E:
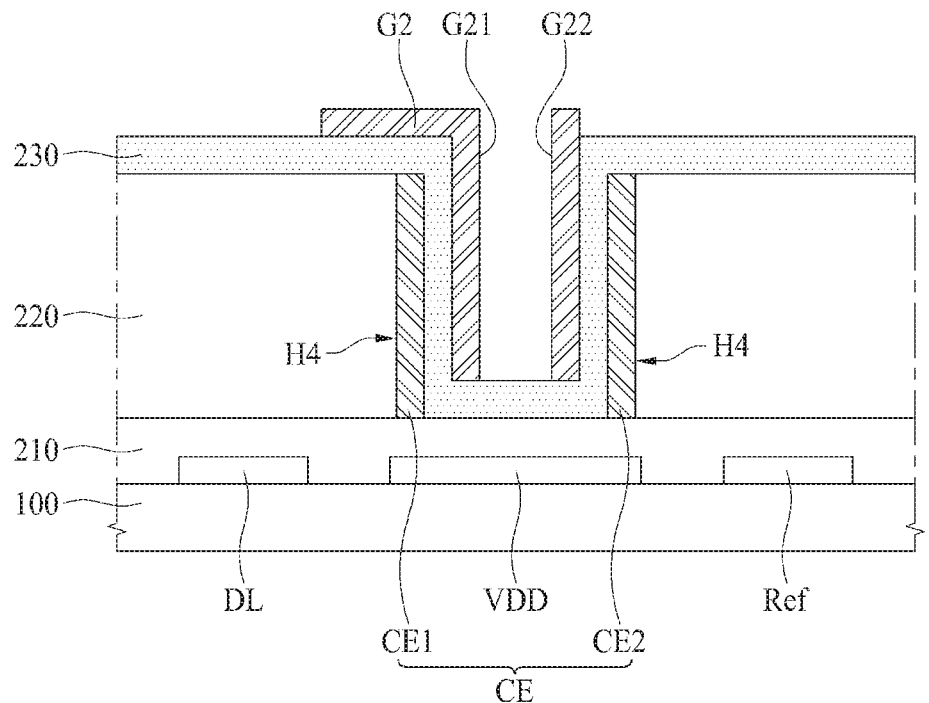

Subsequently, as seen in FIG. 4E, a first portion G21 and a second portion G22 of a second gate electrode G2 can be formed on the first insulation layer 230. The first portion G21 of the second gate electrode G2 can be formed to extend in a horizontal direction and then extend in a vertical direction to an inner portion of the open area OA. The second portion G22 of the second gate electrode G2 can be formed to extend in a vertical direction in the open area OA.

Figure 4F:
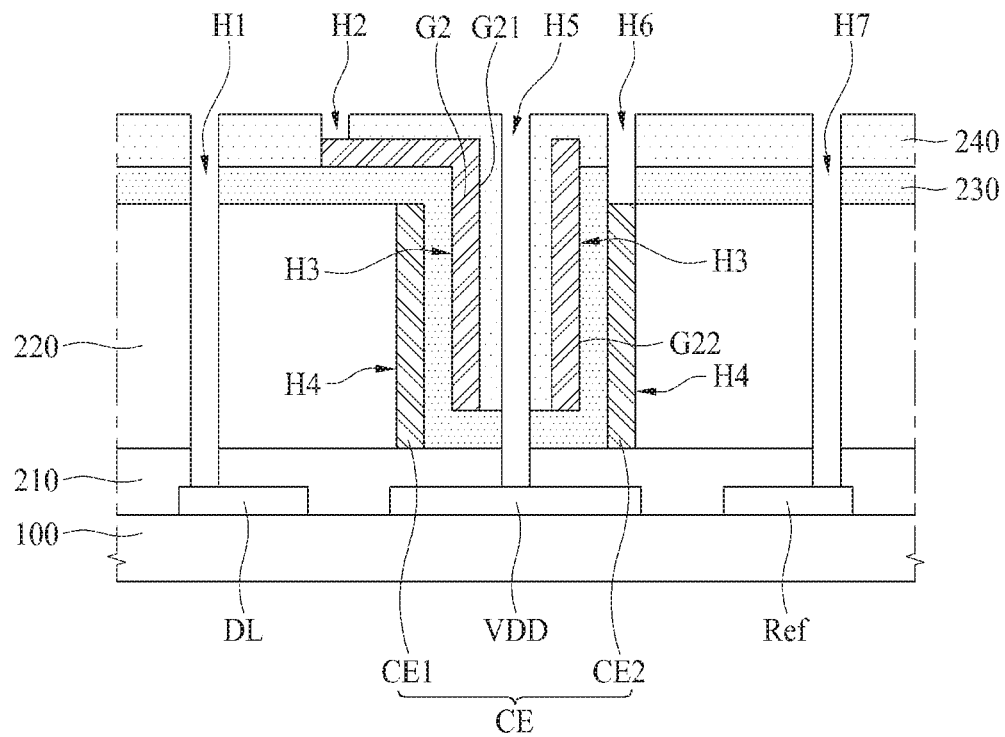

Subsequently, as seen in FIG. 4F, a second insulation layer 240 can be formed on the first insulation layer 230 and the first portion G21 and the second portion G22 of the second gate electrode G2. The second insulation layer 240 can be formed to fill the open area OA.

Since the second insulation layer 240 is formed, the first portion G21 and the second portion G22 of the second gate electrode G2 can extend in a vertical direction in a third hole H3 between the first insulation layer 230 and the second insulation layer 240.

Subsequently, a first hole H1 and a seventh hole H7 can be formed by removing a certain region of each of the lower insulation layer 210, the middle insulation layer 220, the first insulation layer 230, and the second insulation layer 240. Therefore, the data line DL can be exposed by the first hole H1, and the reference line Ref can be exposed by the seventh hole H7.

Moreover, a second hole H2 can be formed by removing a certain region of the second insulation layer 240. Therefore, the second gate electrode G2 can be exposed by the second hole H2.

A fifth hole H5 can be formed by removing a certain region, provided in the open area OA, of each of the lower insulation layer 210, the first insulation layer 230, and the second insulation layer 240. Therefore, the high power line VDD can be exposed by the fifth hole H5.

A sixth hole H6 can be formed by removing a certain region of each of the first insulation layer 230 and the second insulation layer 240. Therefore, the second portion CE2 of the capacitor electrode CE can be exposed by the sixth hole H6.

Figure 4G:
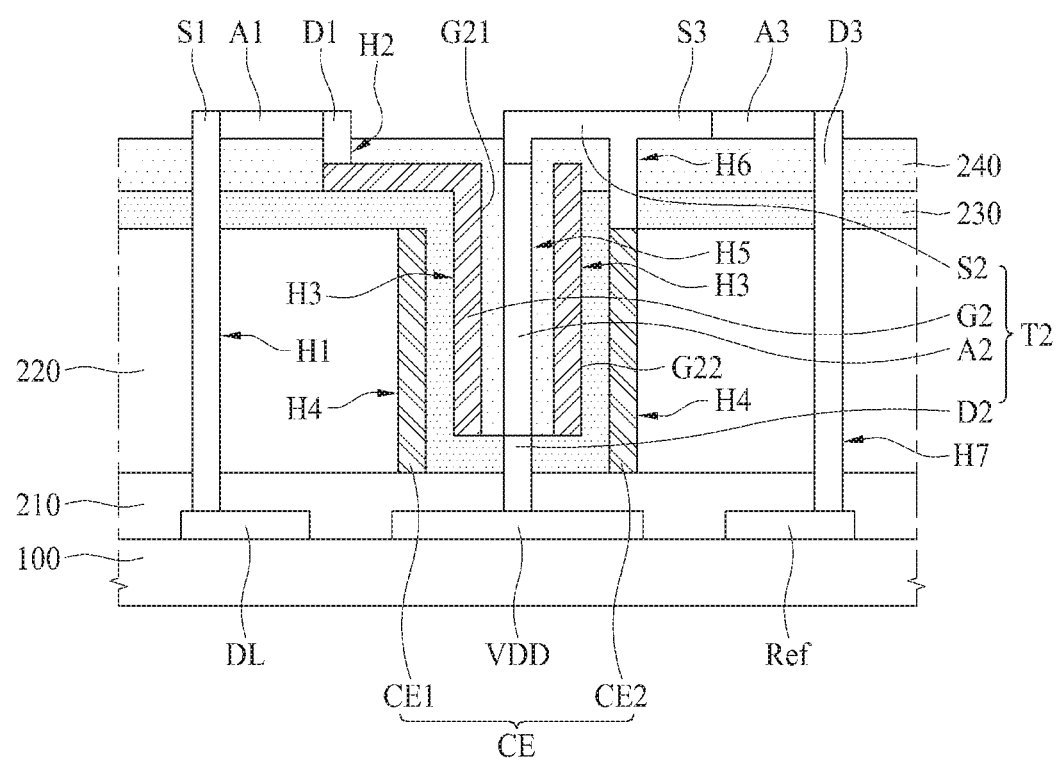

Subsequently as seen in FIG. 4G, a first source electrode S1 can be formed in the first hole H1, a first drain electrode D1 can be formed in the second hole H2, and a first active region A1 connected to each of the first source electrode S1 and the first drain electrode D1 can be formed on the second insulation layer 240. Also, a second drain electrode D2 and a second active region A2 can be formed in the fifth hole H5, a second source electrode S2 extending to an upper surface of the second insulation layer 240 can be formed in the fifth hole H5 and the sixth hole H6, a third source electrode S3 connected to the second source electrode S2 can be formed on the upper surface of the second insulation layer 240, a third active region A3 connected to the third source electrode S3 can be formed on an upper surface of the second insulation layer 240, and a third drain electrode D3 connected to the third active region A3 can be formed in the seventh hole H7.

The first source electrode S1, the first drain electrode D1, the first active region A1, the second drain electrode D2, the second active region A2, the second source electrode S2, the third source electrode S3, the third active region A3, and the third drain electrode D3 can be formed through a process of forming and patterning an oxide semiconductor layer in each of the first hole H1, the second hole H2, the fifth hole H5, the sixth hole H6, and the seventh hole H7 and on the upper surface of the second insulation layer 240 by using a liquid oxide semiconductor such as indium gallium zinc oxide (IGZO) or a liquid semiconductor known to those skilled in the art.

Therefore, the first source electrode S1, the first drain electrode D1, the first active region A1, the second drain electrode D2, the second active region A2, the second source electrode S2, the third source electrode S3, the third active region A3, and the third drain electrode D3 can be formed of the same semiconductor material. In FIG. 4G, the first source electrode S1, the first drain electrode D1, the first active region A1 can merely be divided based on positions thereof and can be substantially provided as one body including the same semiconductor material. Similarly, in FIG. 4G, the second drain electrode D2, the second active region A2, the second source electrode S2, the third source electrode S3, the third active region A3, and the third drain electrode D3 can merely be divided based on positions thereof and can be substantially provided as one body including the same semiconductor material.

Figure 4H:
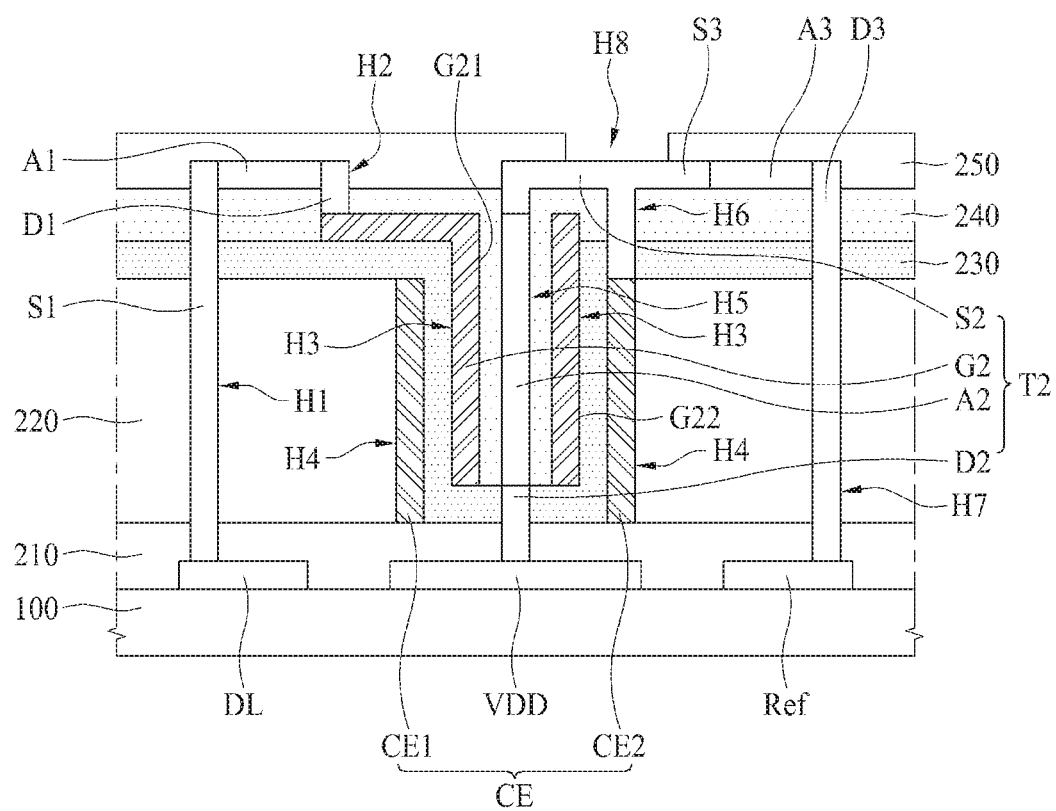

Subsequently, as seen in FIG. 4H, a third insulation layer 250 can be formed on the first source electrode S1, the first drain electrode D1, the first active region A1, the second drain electrode D2, the second active region A2, the second source electrode S2, the third source electrode S3, the third active region A3, and the third drain electrode D3, and an eighth hole H8 can be formed in a certain region of the third insulation layer 250. Therefore, the second source electrode S2 can be exposed by the eighth hole H8.

Figure 4I:
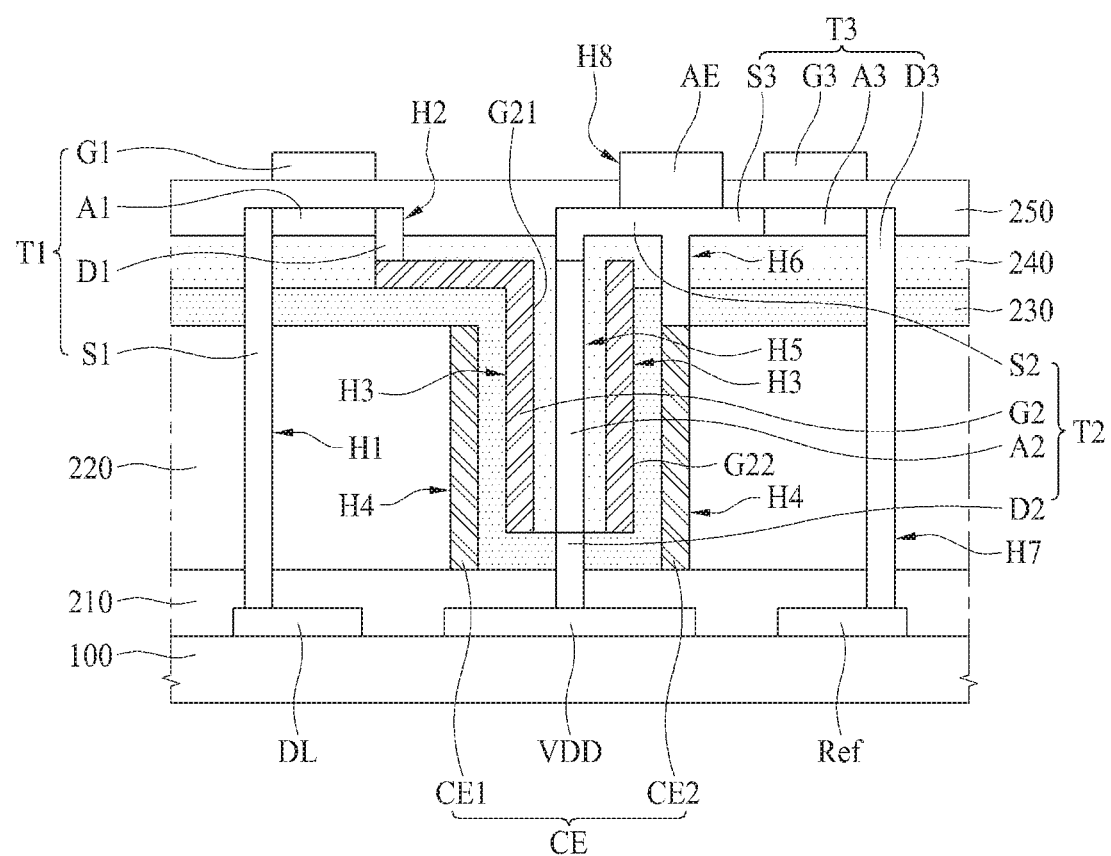

Subsequently, as seen in FIG. 4I, a first gate electrode G1 and a third gate electrode G3 can be formed on the third insulation layer 250, and an auxiliary electrode AE connected to the second source electrode S2 through the eighth hole H8 can be formed.

The first gate electrode G1 can be formed to overlap the first active region A1, and the third gate electrode G3 can be formed to overlap the third active region A3.

Figure 4J:
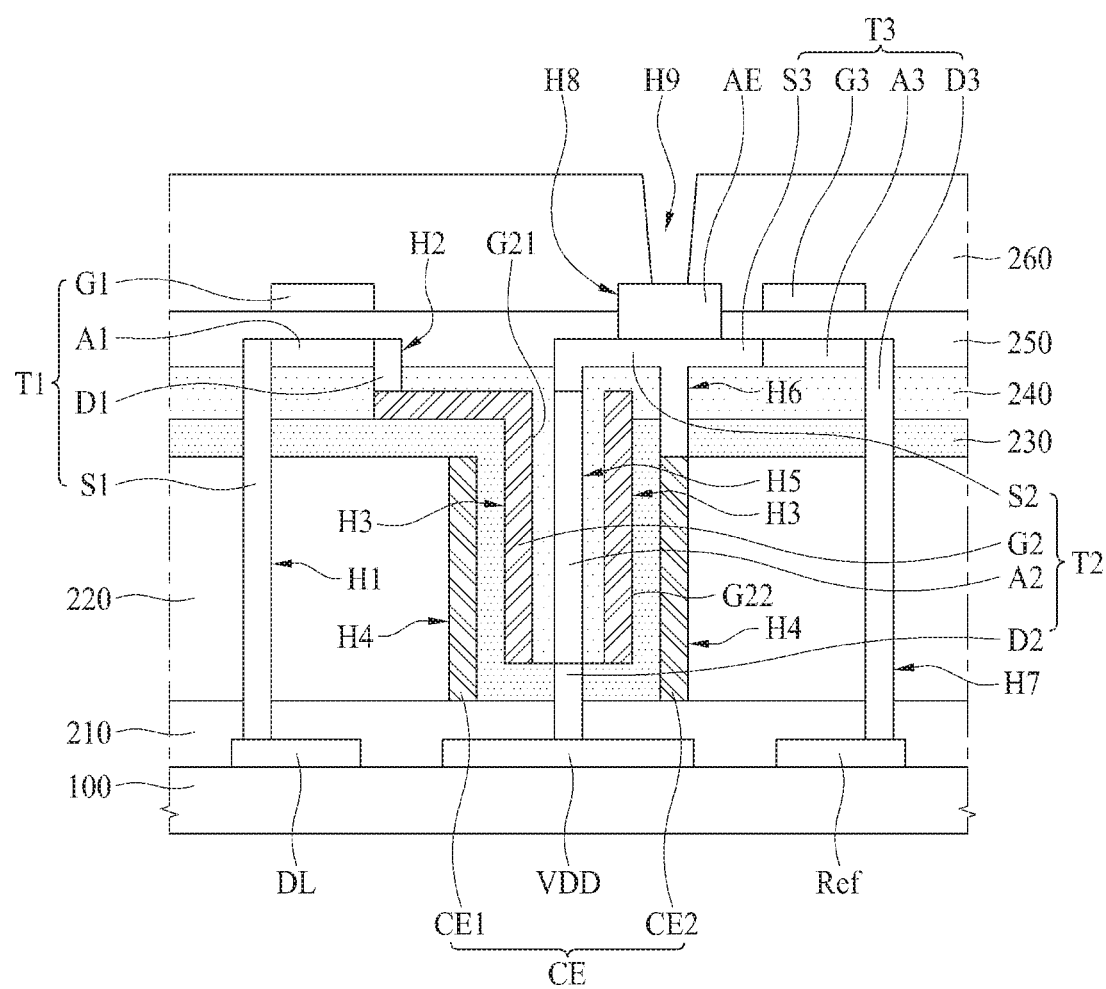

Subsequently, as seen in FIG. 4J, a fourth insulation layer 260 can be formed on the first gate electrode G1, the third gate electrode G3, and the auxiliary electrode AE, and a ninth hole H9 can be formed by removing a certain region of the fourth insulation layer 260. Therefore, the auxiliary electrode AE can be exposed by the ninth hole H9.

Figure 4K:
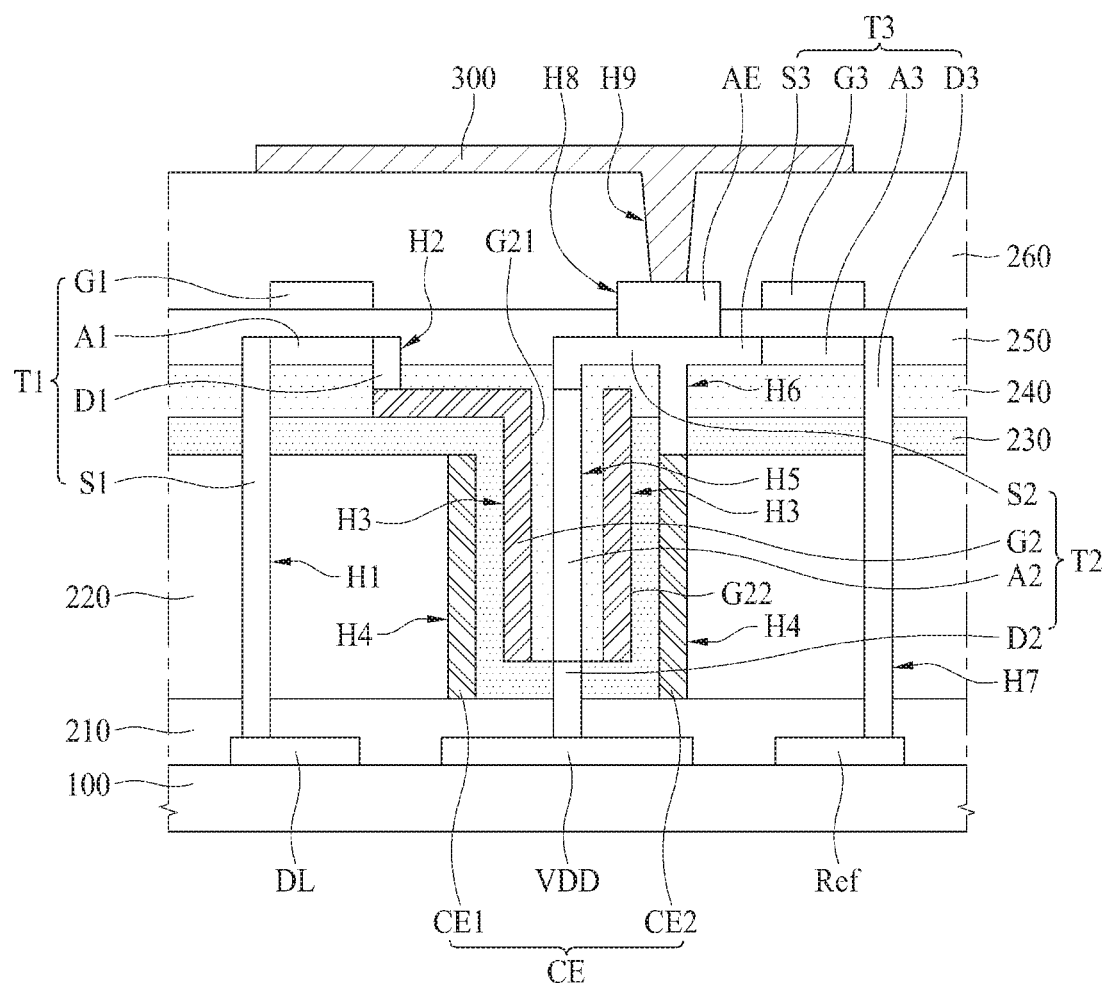

Subsequently, as seen in FIG. 4K, a first electrode 300 connected to the auxiliary electrode AE through the ninth hole H9 can be formed. The first electrode 300 can function as an anode of the electroluminescent display apparatus.

Figure 5:
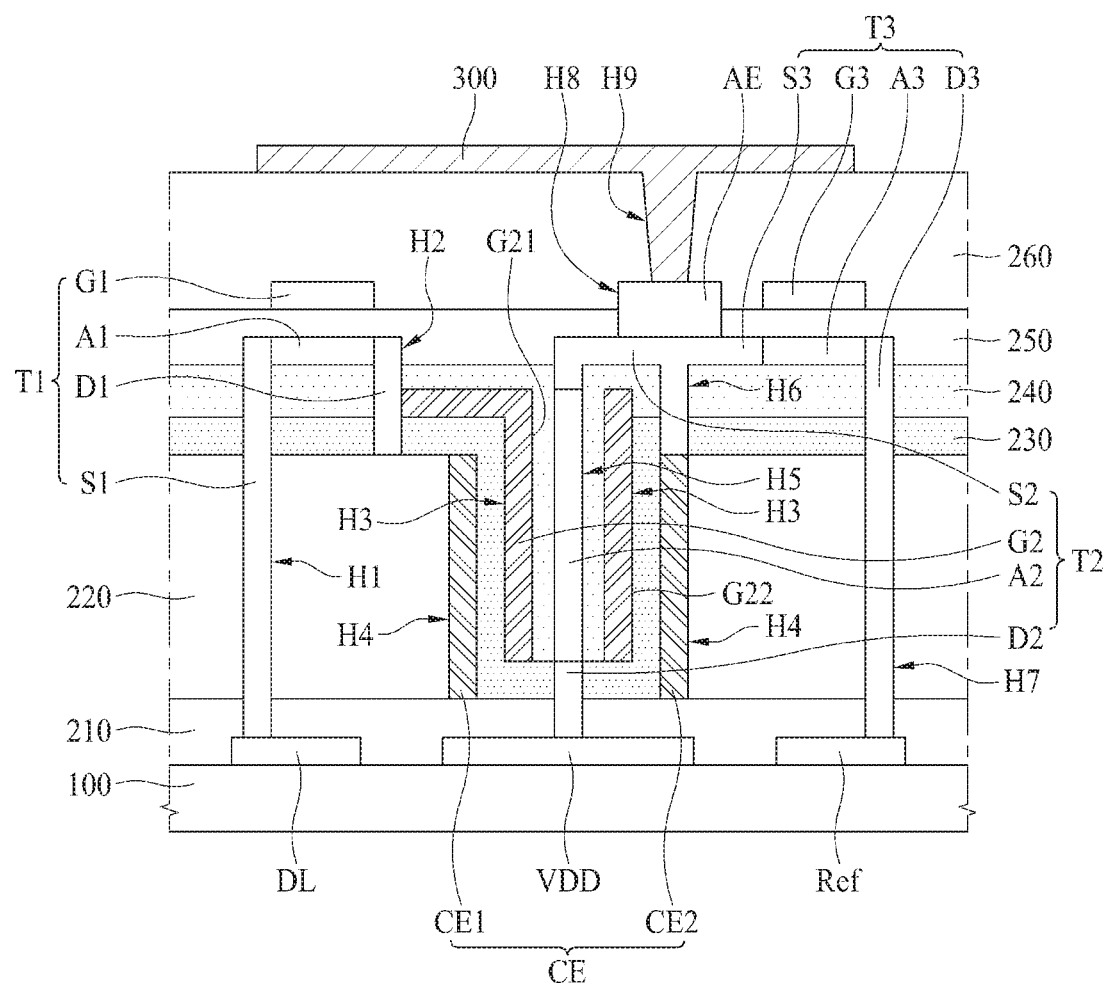
FIG. 5 is a schematic cross-sectional view of an electroluminescent display apparatus according to another embodiment of the present disclosure.

FIG. 5 is a schematic cross-sectional view of an electroluminescent display apparatus according to another embodiment of the present disclosure. Except for that a connection structure between a second gate electrode G2 and a first drain electrode D1 is changed, the electroluminescent display apparatus of FIG. 5 is the same as the electroluminescent display apparatus of FIG. 3. Therefore, like reference numerals refer to like elements throughout, and only different elements will be described below.

According to FIG. 3 described above, a lower surface of a lower end of the first drain electrode D1 can contact an upper surface of the first portion G21 of the second gate electrode G2.

On the other hand, according to FIG. 5, one side surface of a first drain electrode D1 can contact a side surface of an end of a first portion G21 of a second gate electrode G2. Therefore, the first drain electrode D1 can extend in a vertical direction in a second hole H2 provided in each a first insulation layer 230 and a second insulation layer 240.

Figure 6:
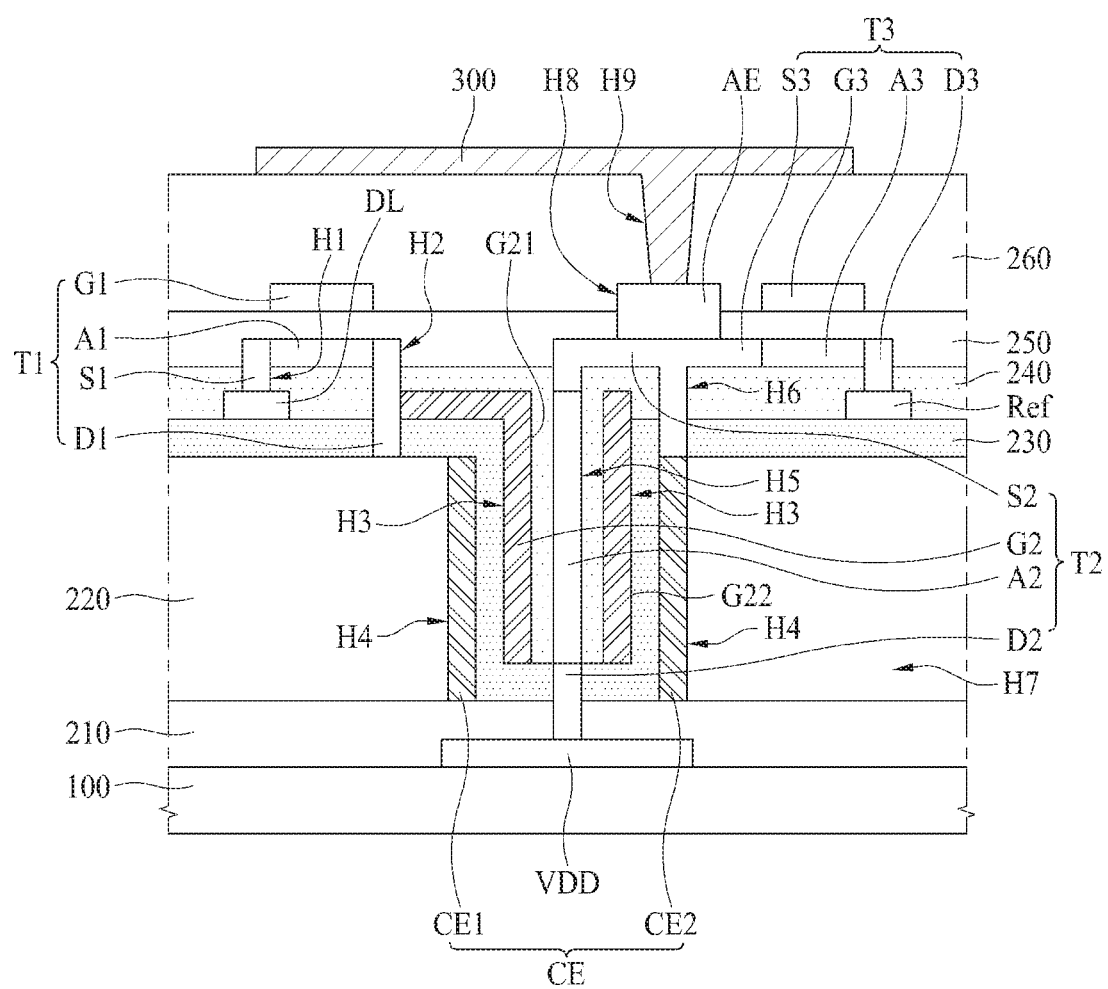
FIG. 6 is a schematic cross-sectional view of an electroluminescent display apparatus according to another embodiment of the present disclosure.

FIG. 6 is a schematic cross-sectional view of an electroluminescent display apparatus according to another embodiment of the present disclosure. Except for that a position of each of a data line DL and a reference line Ref is changed, the electroluminescent display apparatus of FIG. 6 is preferably the same as (or similar to) the electroluminescent display apparatus of FIG. 5. Therefore, like reference numerals refer to like elements throughout, and only different elements will be described below.

According to FIG. 5 described above, a data line DL and a reference line Ref can be provided on a substrate 100, and thus, the data line DL, the reference line Ref, and a high power line VDD can be provided on the same layer.

On the other hand, according to FIG. 6, a data line DL and a reference line Ref can be provided on an upper surface of a first insulation layer 230, and thus, can be provided on the same layer. However, the data line DL and the reference line Ref can be provided on a layer differing from a high power line VDD.

According to FIG. 6, since the data line DL is provided on the upper surface of the first insulation layer 230, a vertical-direction length of a first source electrode S1 which is connected to the data line DL to extend in a vertical direction can be reduced compared to the above-described embodiment of FIG. 5, and thus, a resistance of the first source electrode S1 can decrease. Also, since the reference line Ref is provided on the upper surface of the first insulation layer 230, a vertical-direction length of a third drain electrode D3 which is connected to the reference line Ref to extend in a vertical direction can be reduced compared to the above-described embodiment of FIG. 5, and thus, a resistance of the third drain electrode D3 can decrease.

Figure 7:
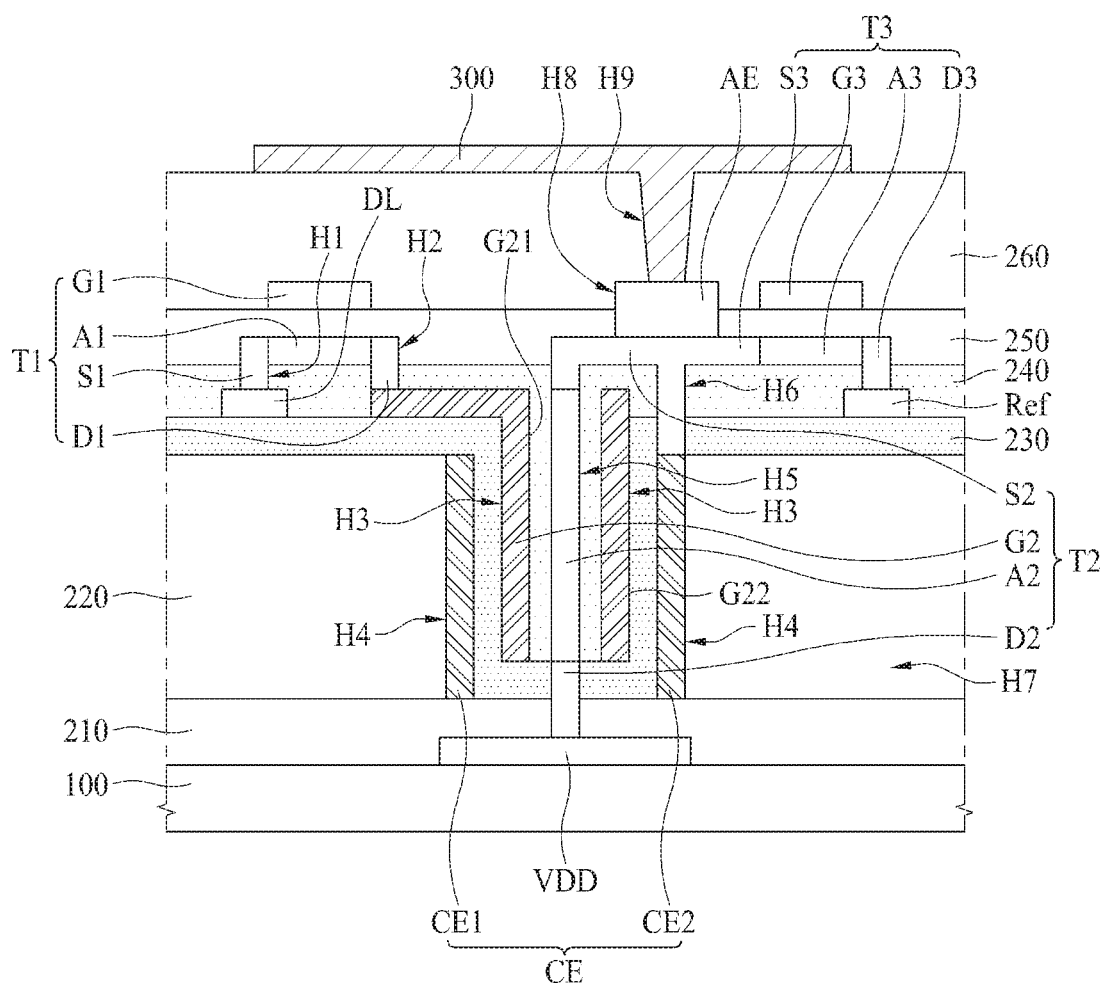
FIG. 7 is a schematic cross-sectional view of an electroluminescent display apparatus according to another embodiment of the present disclosure.

FIG. 7 is a schematic cross-sectional view of an electroluminescent display apparatus according to another embodiment of the present disclosure. Except for that a position of each of a data line DL and a reference line Ref is changed, the electroluminescent display apparatus of FIG. 7 is preferably the same as (or similar to) the electroluminescent display apparatus of FIG. 3. Therefore, like reference numerals refer to like elements throughout, and only different elements will be described below.

According to FIG. 3 described above, a data line DL and a reference line Ref can be provided on a substrate 100, and thus, the data line DL, the reference line Ref, and the high power line VDD can be provided on the same layer.

On the other hand, according to FIG. 7, a data line DL and a reference line Ref can be provided on an upper surface of a first insulation layer 230, and thus, can be provided on the same layer. However, the data line DL and the reference line Ref can be provided on a layer differing from a high power line VDD.

According to FIG. 7, since the data line DL is provided on the upper surface of the first insulation layer 230, a vertical-direction length of a first source electrode S1 which is connected to the data line DL to extend in a vertical direction can be reduced compared to the above-described embodiment of FIG. 3, and thus, a resistance of the first source electrode S1 can decrease. Also, since the reference line Ref is provided on the upper surface of the first insulation layer 230, a vertical-direction length of a third drain electrode D3 which is connected to the reference line Ref to extend in a vertical direction can be reduced compared to the above-described embodiment of FIG. 3, and thus, a resistance of the third drain electrode D3 can decrease.

Figure 8:
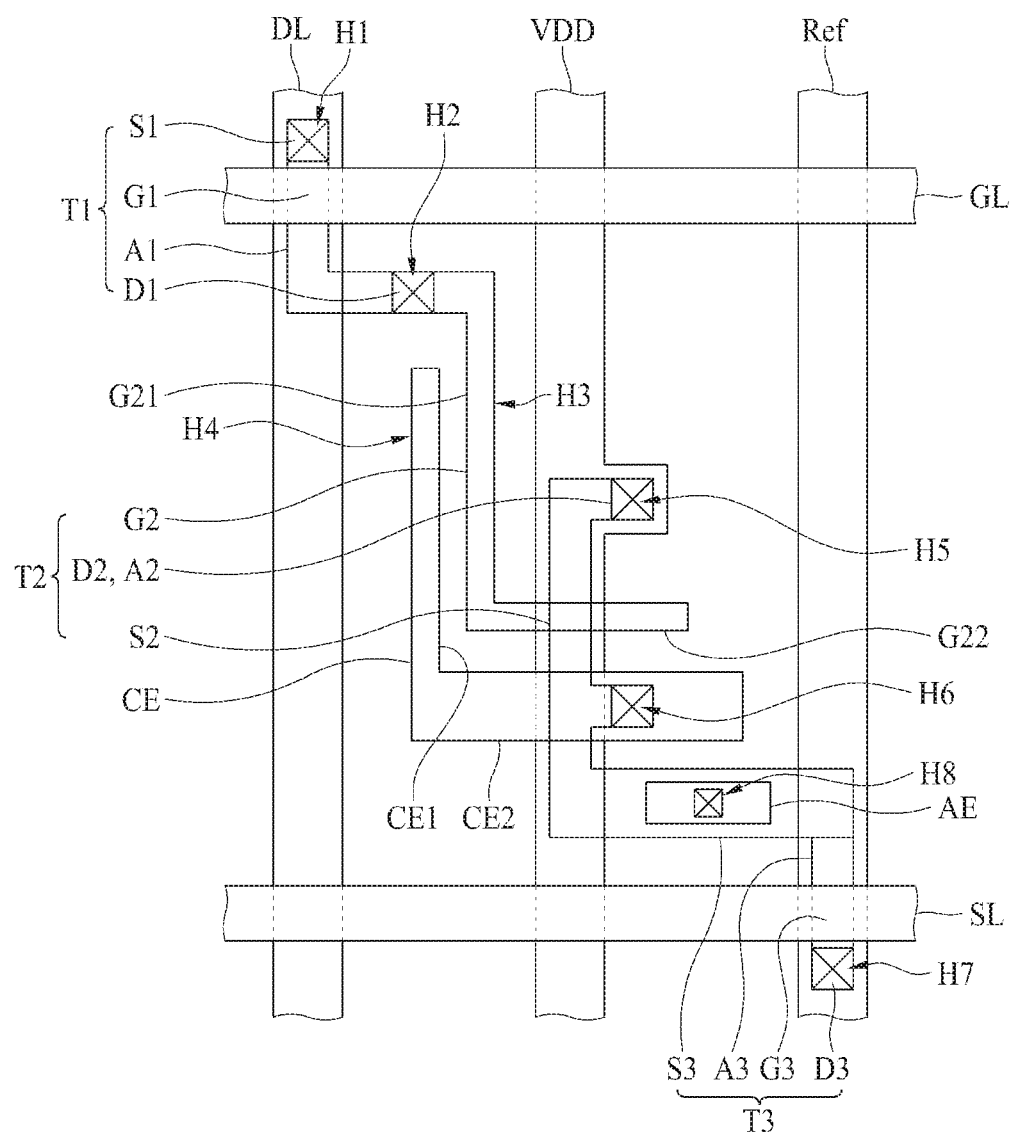
FIG. 8 is a schematic plan view of an electroluminescent display apparatus according to another embodiment of the present disclosure.

FIG. 8 is a schematic plan view of an electroluminescent display apparatus according to another embodiment of the present disclosure. Except for that a configuration of each of a second gate electrode G2 and a capacitor electrode CE is changed, the electroluminescent display apparatus of FIG. 8 is preferably the same as (or similar to) the electroluminescent display apparatus of FIG. 2. Therefore, like reference numerals refer to like elements throughout, and only different elements will be described below.

According to FIG. 2 described above, the second gate electrode G2 can include the first portion G21, the second portion G22, the third portion G23, and the fourth portion G24, and the capacitor electrode CE can include the first portion CE1, the second portion CE2, the third portion CE3, and the fourth portion CE4. In FIG. 2, a capacitor can be configured between the first portion G21 of the second gate electrode G2 and the first portion CE1 of the capacitor electrode CE, a capacitor can be configured between the second portion G22 of the second gate electrode G2 and the second portion CE2 of the capacitor electrode CE, a capacitor can be configured between the third portion G23 of the second gate electrode G2 and the third portion CE3 of the capacitor electrode CE, and a capacitor can be configured between the fourth portion G24 of the second gate electrode G2 and the fourth portion CE4 of the capacitor electrode CE, thereby increasing a capacity of each of the capacitors.

On the other hand, according to FIG. 8, a second gate electrode G2 can include a first portion G21 and a second portion G22, and a capacitor electrode CE can include a first portion CE1 and a second portion CE2. According to the embodiment of FIG. 8, a capacity of a capacitor can be reduced compared to the embodiment of FIG. 2. However, since a third portion G23 and a fourth portion G24 of a second gate electrode G2 and a third portion CE3 and a fourth portion CE4 of a capacitor electrode CE are removed, a size of each subpixel can be reduced, thereby implementing a high-resolution electroluminescent display apparatus.

The second gate electrode G2 can include the first portion G21, the second portion G22, and the third portion G23 of FIG. 2 described above, and the capacitor electrode CE can include the first portion CE1, the second portion CE2, and third portion CE3 of FIG. 2. Also, the second gate electrode G2 can include the first portion G21 and the capacitor electrode CE can include the first portion CE1, and in this case, the first portion CE1 of the capacitor electrode CE can be connected to the second source electrode S2.

Figure 9:
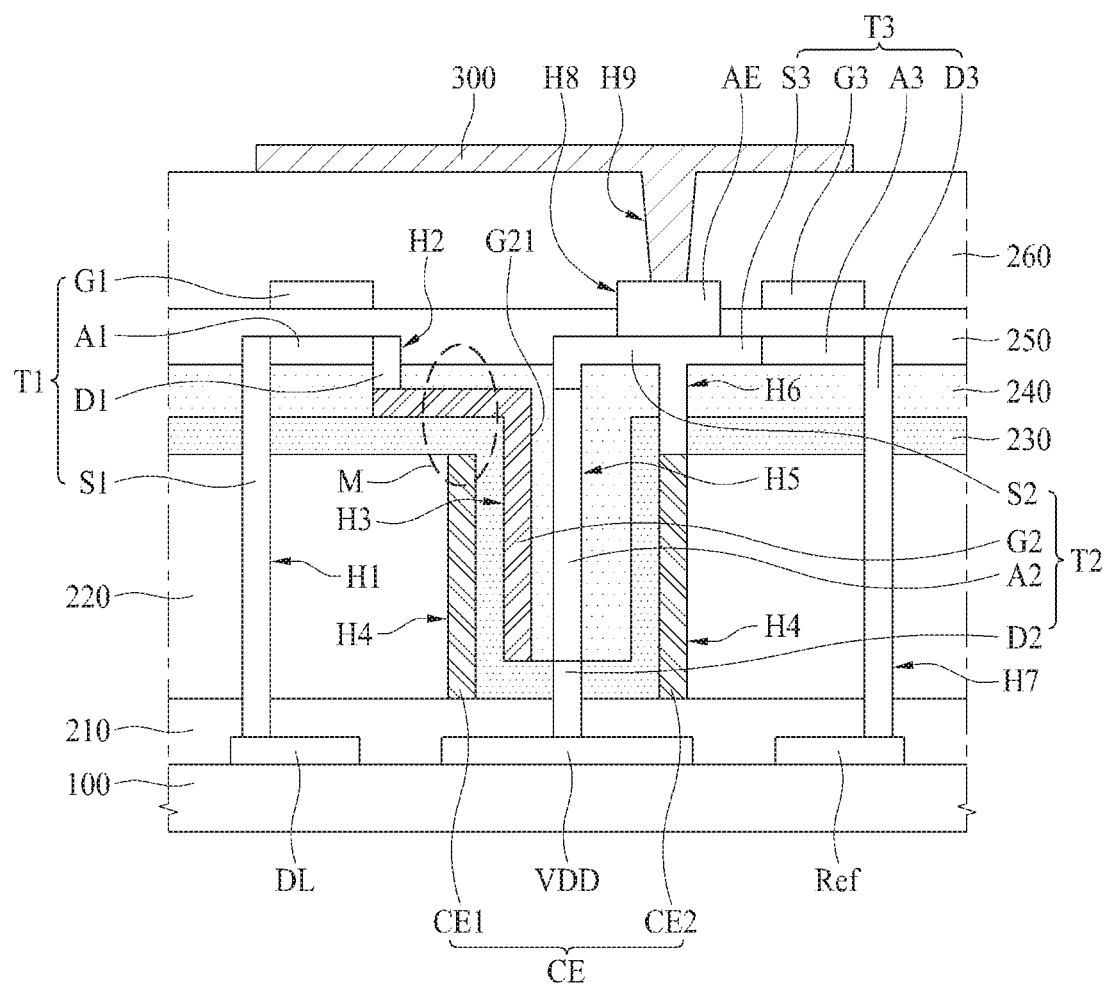
FIG. 9 is a schematic cross-sectional view of an electroluminescent display apparatus according to another embodiment of the present disclosure.

FIG. 9 is a schematic cross-sectional view of an electroluminescent display apparatus according to another embodiment of the present disclosure. Except for that a second portion G22 of a second gate electrode G2 is omitted, the electroluminescent display apparatus of FIG. 9 is preferably the same as (or similar to) the electroluminescent display apparatus of FIG. 3. Hereinafter, therefore, only different elements will be described.

According to FIG. 9, a second gate electrode G2 can include a first portion G21 and may not include second to fourth portions G22 to G24. Therefore, a capacitor can be provided between only the first portion G21 of the second gate electrode G2 and a first portion CE1 of a capacitor electrode CE.

According to FIG. 9, since the second gate electrode G2 includes the first portion G21, an area occupied by the second gate electrode G2 can be reduced, and thus, a size of each subpixel can be reduced, thereby implementing a high-resolution electroluminescent display apparatus.

In FIG. 9, a second portion CE2 of the capacitor electrode CE can be omitted, and in this case, the first portion CE1 of the capacitor electrode CE can be electrically connected to a second source electrode S2.

In FIG. 9, the first portion G21 can be configured to contact a side surface of a first drain electrode D1 as in FIG. 5, the first portion G21 can be configured to contact the side surface of the first drain electrode D1 and a data line DL and a reference line Ref can be provided on an upper surface of a first insulation layer as in FIG. 6, and the data line DL and the reference line Ref can be provided on the upper surface of the first insulation layer as in FIG. 7.

Figure 10:
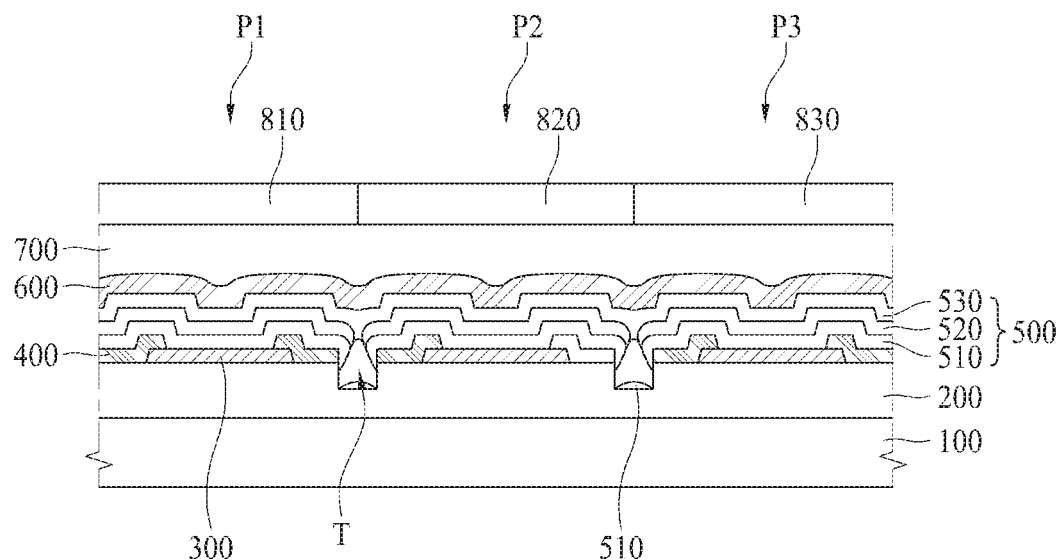
FIG. 10 is a schematic cross-sectional view of an electroluminescent display apparatus according to another embodiment of the present disclosure.

FIG. 10 is a schematic cross-sectional view of an electroluminescent display apparatus according to another embodiment of the present disclosure and illustrates an electroluminescent display apparatus including a plurality of subpixels.

As seen in FIG. 10, the electroluminescent display apparatus according to another embodiment of the present disclosure can include a substrate 100, a circuit device layer 200, a first electrode 300, a bank 400, a light emitting layer 500, a second electrode 600, an encapsulation layer 700, and a plurality of color filter layers 810 to 830.

The substrate 100 can be as described above, and thus, its repetitive description is omitted.

The circuit device layer 200 can be provided on the substrate 100.

A data line DL, a high power line VDD, a reference line Ref, a gate line GL, a sensing line SL, a switching TFT T1, a driving TFT T2, a sensing TFT T3, a capacitor electrode CE, an auxiliary electrode AE, and the lower insulation layer 210, the middle insulation layer 220, and the first to fourth insulation layers 230 to 260 according to the above-described various embodiments can be provided in the circuit device layer, and their repetitive descriptions are omitted.

The first electrode 300 can be patterned on the circuit device layer 200 in each of the subpixels P1 to P3. As in the above-described various embodiments, the first electrode 300 can be connected to a second source electrode S2 through the auxiliary electrode AE.

The bank 400 can be provided on the circuit device layer 200 and can be provided in a boundary between the subpixels P1 to P3 to cover an edge of the first electrode 300. An exposure region, which is exposed without being covered by the bank 400, of the first electrode 300 can be an emission area.

The light emitting layer 500 can be provided on the first electrode 300. The light emitting layer 500 can be provided on the bank 400. That is, the light emitting layer 500 can be provided in the subpixels P1 to P3 and a boundary region therebetween.

The light emitting layer 500 can be provided to emit white (W) light. To this end, the light emitting layer 500 can include a plurality of stacks which emit lights of different colors.

For example, the light emitting layer 500 can include a first stack 510 emitting blue light, a second stack 530 emitting yellowish green light, and a charge generating layer (CGL) 520 provided between the first stack 510 and the second stack 530. The first stack 510 and the second stack 520 can each include a hole transporting layer, an organic light emitting layer, and an electron transporting layer which are sequentially stacked. The light emitting layer 510 can include a first stack emitting blue light, a second stack emitting green light, a third stack emitting red light, a first charge generating layer between the first stack and the second stack, and a second charge generating layer between the second stack and the third stack. A configuration of the light emitting layer 500 can be changed to various types known to those skilled in the art.

According to an embodiment of the present disclosure, a trench T can be provided in the bank 400 and the circuit device layer 200, and thus, the light emitting layer 500 can be provided in the trench T. Therefore, a current path can be long provided between adjacent subpixels P1 to P3, thereby decreasing a leakage current occurring between the subpixels P1 to P3. The trench T can be provided in the bank 400 and the fourth insulation layer 260 of the circuit device layer 200, but is not limited thereto. Depending on the case, the trench T can be provided in only the bank 400.

In a case where an interval between the subpixels P1 to P3 is very short for realizing a high resolution, when light is emitted from a light emitting layer in one of the subpixels P1 to P3, there is a possibility that an electric charge in the light emitting layer can move to an adjacent subpixel to cause a leakage current.

Therefore, in another embodiment of the present disclosure, the trench T can be provided in a boundary between individual subpixels P1 to P3, and the light emitting layer 500 can be provided in the trench T, thereby decreasing a leakage current occurring between the subpixels P1 to P3 adjacent to one another.

The first stack 510 can be provided at (e.g., on) an inner side surface of the trench T, and moreover, can be provided at (e.g., on) an inner lower surface of the trench T. In this case, a portion of the first stack 510 provided at the inner side surface of the trench T can be disconnected from a portion of the first stack 510 provided at the inner lower surface of the trench T. Therefore, a portion of the first stack 510 provided at one side surface (for example, a left surface) of an inner portion of the trench T can be disconnected from a portion of the first stack 510 provided at the other side surface (for example, a right surface) of the inner portion of the trench T. Accordingly, an electric charge may not move, through the first stack 510, between the subpixels P1 to P3 which are disposed adjacent to one another with the trench T therebetween.

Moreover, the charge generating layer 520 can be provided on the first stack 510 at the inner side surface of the trench T. In this case, a portion of the charge generating layer 520 provided at the one side surface (for example, the left surface) of the inner portion of the trench T can be disconnected from a portion of the charge generating layer 520 provided at the other side surface (for example, the right surface) of the inner portion of the trench T. Accordingly, an electric charge may not move, through the charge generating layer 520, between the subpixels P1 to P3 which are disposed adjacent to one another with the trench T therebetween.

The second stack 530 can connect between the subpixels P1 to P3 which are disposed adjacent to one another with the trench T therebetween on the charge generating layer 520. Therefore, an electric charge can move, through the second stack 530, between the subpixels P1 to P3 which are disposed adjacent to one another with the trench T therebetween. However, the present disclosure is not limited thereto, and by appropriately adjusting a shape of the trench T and a deposition process performed on the light emitting layer 500, the second stack 530 can be disconnected between the subpixels P1 to P3 which are disposed adjacent to one another with the trench T therebetween. Particularly, only a portion of a lower portion of the second stack 530 adjacent to the charge generating layer 520, for example, HTL, can be disconnected in a region between the subpixels P1 to P3.

The charge generating layer 520 can be higher in conductivity than the first stack 510 and the second stack 530. Particularly, an N-type charge generating layer configuring the charge generating layer 520 can include a metal material, and thus, can be higher in conductivity than the first stack 510 and the second stack 530. Therefore, the movement of an electric charge between the subpixels P1 to P3 disposed adjacent to one another can be performed through the charge generating layer 520, and the amount of electric charges moving through the second stack 530 can be very small.

In another embodiment of the present disclosure, when the light emitting layer 500 is provided in the trench T, a portion of the light emitting layer 500, particularly, the first stack 510 and the charge generating layer 520 can be disconnected in the trench T, thereby preventing the occurrence of a leakage current between the subpixels P1 to P3 adjacent to one another.

The second electrode 600 can be provided on the light emitting layer 500. The second electrode 600 can function as a cathode. The second electrode 600 can be provided in the subpixels P1 to P3 and a boundary region therebetween like the light emitting layer 500. That is, the second electrode 600 can be provided on the bank 400.

The encapsulation layer 700 can be provided on the second electrode 600. The encapsulation layer 700 can be provided on the second electrode 600 to prevent external water from penetrating into the light emitting layer 500. The encapsulation layer 700 can be formed of an inorganic insulating material or can be formed in a structure where an inorganic insulating material and an organic insulating material are alternately stacked, but is not limited thereto.

The color filter layers 810 to 830 can be provided on the encapsulation layer 700. The color filter layers 810 to 830 can be provided to respectively face emission areas of individual subpixels P1 to P3. The color filter layers 810 to 830 can include a first color filter 810 of red, a second color filter 820 of green, and a third color filter 830 of blue, but are not limited thereto. A black matrix can be additionally provided in a boundary between the color filter layers 810 to 830 and can prevent light from being leaked to a region other than the emission areas.

In FIG. 10, the light emitting layer 500 configured to emit white light can be provided in the subpixels P1 to P3 and the whole boundary region therebetween, and thus, the trench T can be provided in the bank 400 and the circuit device layer 200 so as to prevent a leakage current between the subpixels P1 to P3 adjacent to one another. However, the present disclosure is not limited to the structure illustrated in FIG. 9. For example, in the present disclosure, the light emitting layer 500 patterned to emit lights of different colors in the subpixels P1 to P3 can be provided, and in this case, a leakage current may not occur between the subpixels P1 to P3 adjacent to one another, whereby the trench T may not be provided in the bank 400 and the circuit device layer 200.

Figure 11A:
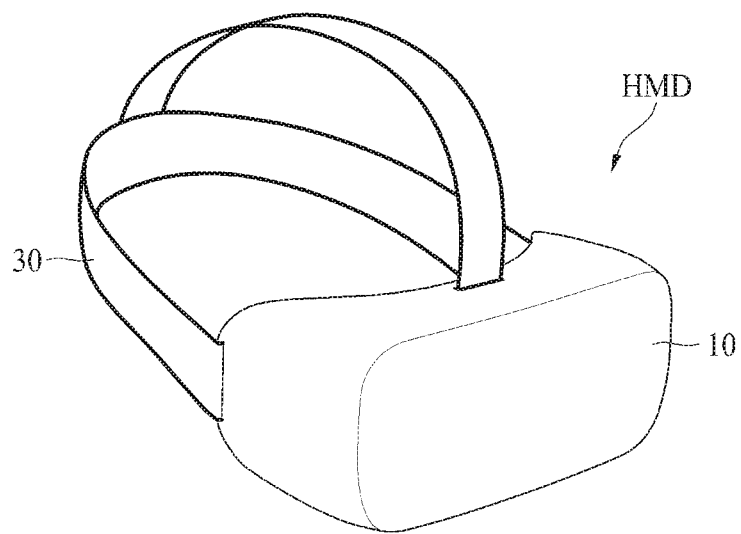
FIGS. 11A to 11C relate to an electroluminescent display apparatus according to another embodiment of the present disclosure and relate to a head-mounted display (HMD) apparatus.
Figure 11B:
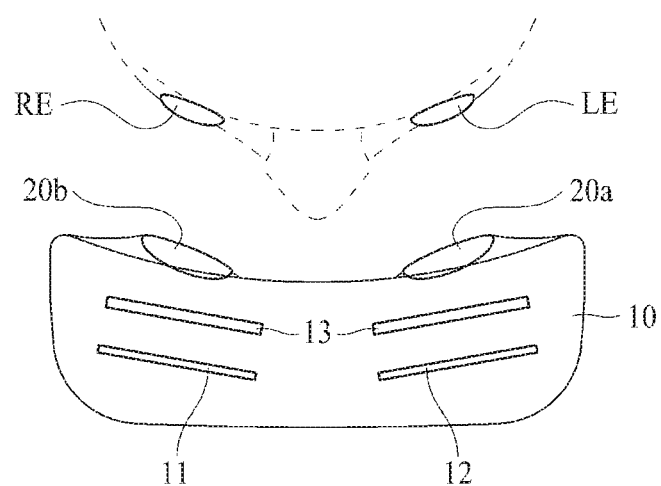
Figure 11C:
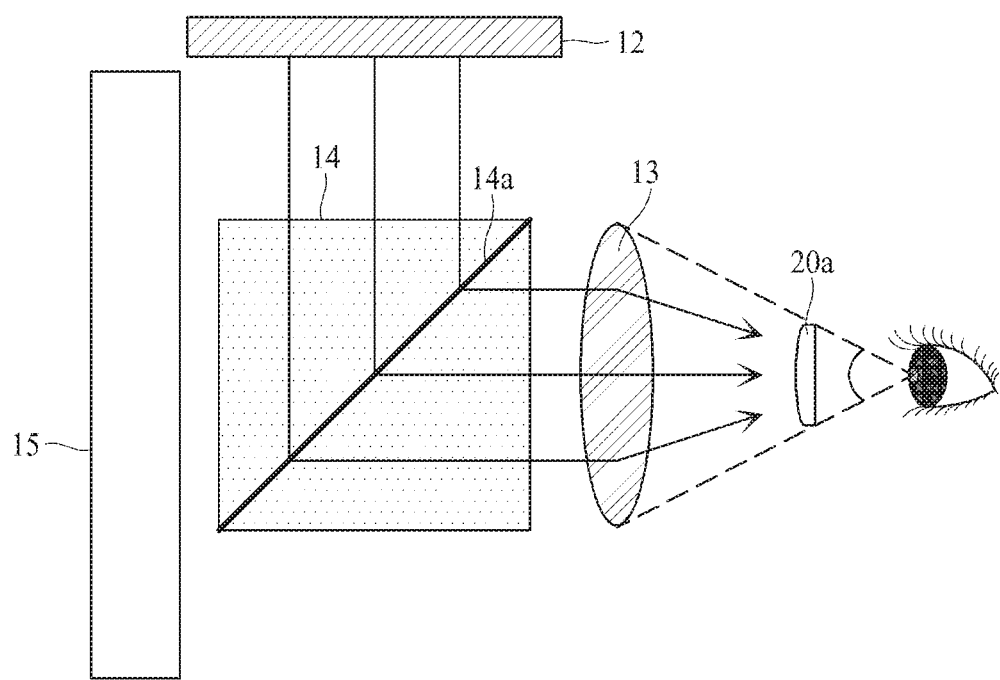

FIGS. 11A to 11C relate to an electroluminescent display apparatus according to another embodiment of the present disclosure and relate to a head-mounted display (HMD) apparatus. FIG. 11A is a schematic perspective view, FIG. 11B is a schematic plan view of a virtual reality (VR) structure, and FIG. 11C is a schematic cross-sectional view of an augmented reality (AR) structure. All the components of the HMD apparatus according to all embodiments of the present disclosure are operatively coupled and configured.

As seen in FIG. 11A, the HMD apparatus according to the present disclosure can include an accommodating case 10 and a head-mounted band 30.

The accommodating case 10 can accommodate elements such as a display apparatus, a lens array, and an eyepiece lens.

The head-mounted band 30 can be fixed to the accommodating case 10. The head-mounted band 30 is illustrated as being provided to surround an upper surface of both side surfaces of a user, but is not limited thereto. The head-mounted band 30 can fix the HMD apparatus to a head of a user and can be replaced by a glasses frame type structure or a helmet type structure.

As seen in FIG. 11B, an HMD apparatus having the VR structure according to the present disclosure can include a left-eye display apparatus 12, a right-eye display apparatus 11, a lens array 13, a left-eye eyepiece lens 20a, and a right-eye eyepiece lens 20b.

The left-eye display apparatus 12, the right-eye display apparatus 11, the lens array 13, the left-eye eyepiece lens 20a, and the right-eye eyepiece lens 20b can be accommodated into the accommodating case 10.

The left-eye display apparatus 12 and the right-eye display apparatus 11 can display the same image, and in this case, a user can watch a two-dimensional (2D) image. Alternatively, the left-eye display apparatus 12 can display a left-eye image, and the right-eye display apparatus 11 can display a right-eye image. Each of the left-eye display apparatus 12 and the right-eye display apparatus 11 can be configured as the electroluminescent display apparatus according to the above-described various embodiments. In this case, a surface (for example, color filter layers 810 to 830) displaying an image in the electroluminescent display apparatus according to the above-described various embodiments can face the lens array 13.

The lens array 13 can be spaced apart from each of the left-eye eyepiece lens 20a and the left-eye display apparatus 12 and can be provided between the left-eye eyepiece lens 20a and the left-eye display apparatus 12. That is, the lens array 13 can be disposed in front of the left-eye eyepiece lens 20a and behind the left-eye display apparatus 12. Also, the lens array 13 can be spaced apart from each of the right-eye eyepiece lens 20b and the right-eye display apparatus 11 and can be provided between the right-eye eyepiece lens 20b and the right-eye display apparatus 11. That is, the lens array 13 can be disposed in front of the right-eye eyepiece lens 20b and behind the right-eye display apparatus 11.

The lens array 13 can be a micro-lens array. The lens array 13 can be replaced by a pin hole array. By using the lens array 13, an image displayed by the left-eye display apparatus 12 or the right-eye display apparatus 11 can be zoomed in by a certain magnification, and thus, a zoomed-in image can be seen by a user.

A left eye LE of a user can be located at the left-eye eyepiece lens 20a, and a right eye RE of the user can be located at the right-eye eyepiece lens 20b.

As seen in FIG. 11C, an HMD apparatus having the AR structure according to the present disclosure can include a left-eye display apparatus 12, a lens array 13, a left-eye eyepiece lens 20a, a transmissive reflection part 14, and a transmissive window 15. In FIG. 11C, for convenience, only left-eye elements are illustrated, and right-eye elements can be the same as the left-eye elements.

The left-eye display apparatus 12, the lens array 13, the left-eye eyepiece lens 20a, the transmissive reflection part 14, and the transmissive window 15 can be accommodated into the accommodating case 10.

The left-eye display apparatus 12 can be disposed in one side (for example, an upper side) of the transmissive reflection part 14 without covering the transmissive window 15. Therefore, the left-eye display apparatus 12 can provide an image to the transmissive reflection part 14 without covering an external background seen through the transmissive window 15.

The left-eye display apparatus 12 can be configured as the electroluminescent display apparatus according to the above-described various embodiments. In this case, a surface (for example, color filter layers 810 to 830) displaying an image in the electroluminescent display apparatus according to the above-described various embodiments can face the transmissive reflection part 14.

The lens array 13 can be provided between the left-eye eyepiece lens 20a and the transmissive reflection part 14.

The left eye of the user can be located at the left-eye eyepiece lens 20a.

The transmissive reflection part 14 can be disposed between the lens array 13 and the transmissive window 15. The transmissive reflection part 14 can include a reflection surface 14a which transmits a portion of light and reflects the other portion of the light. The reflection surface 14a can be provided so that an image displayed by the left-eye display apparatus 12 travels to the lens array 13. Accordingly, the user can see, through the transmissive window 15, all of the external background and the image displayed by the left-eye display apparatus 12. That is, the user can see one image which includes a real background and a virtual image, and thus, AR can be implemented.

The transmissive window 15 can be disposed in front of the transmissive reflection part 14.

Hereinabove, the electroluminescent display apparatus according to the various embodiments of the present disclosure has been described, but the present disclosure can be applied to various display apparatuses including the elements of each of the above-described TFTs.

As described above, according to the embodiments of the present disclosure, a second gate electrode and a capacitor electrode each configuring a capacitor can be configured to extend in a vertical direction with respect to a substrate surface, and thus, a capacity of the capacitor can increase in a narrow region in a plan view.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

What is claimed is:

1. An electroluminescent display apparatus comprising:
   a driving thin film transistor on a substrate, the driving thin film transistor including a gate electrode, a source electrode, a drain electrode, and an active region;
   a capacitor electrode facing the gate electrode;
   a first electrode electrically connected to the source electrode;
   a light emitting layer on the first electrode; and
   a second electrode on the light emitting layer,
   wherein the gate electrode and the capacitor electrode extend in a vertical direction with respect to a surface of the substrate.

2. The electroluminescent display apparatus of claim 1, further comprising a first insulation layer provided between the gate electrode and the capacitor electrode to extend in the vertical direction with respect to the surface of the substrate.

3. The electroluminescent display apparatus of claim 1, further comprising a second insulation layer provided between the gate electrode and the active region to extend in the vertical direction with respect to the surface of the substrate, wherein
the gate electrode and the active region face each other with the second insulation layer therebetween, and
the active region extends in the vertical direction with respect to the surface of the substrate, wherein the drain electrode extends in the vertical direction with respect to the surface of the substrate, and an upper end of the drain electrode contacts a lower end of the active region.

4. The electroluminescent display apparatus of claim 1, wherein
the gate electrode comprises a portion extending in a horizontal direction and a portion extending in the vertical direction, with respect to the surface of the substrate, and the portion of the gate electrode extending in the horizontal direction is provided above the capacitor electrode, and
the gate electrode and the capacitor electrode intersect each other with respect to a plan view, and the portion of the gate electrode extending in the horizontal direction on the capacitor electrode is provided in a region where the gate electrode and the capacitor electrode intersect each other.

5. The electroluminescent display apparatus of claim 1, further comprising:
a bank provided to cover an edge of the first electrode; and
a trench provided in the bank;
wherein a portion of the light emitting layer is disconnected in the trench.

6. The electroluminescent display apparatus of claim 1, further comprising:
a lens array spaced apart from the substrate; and
an accommodating case accommodating the substrate and the lens array.

7. A display apparatus comprising the electroluminescent display apparatus of claim 1.

8. The electroluminescent display apparatus of claim 1, further comprising:
a switching thin film transistor on the substrate, the switching thin film transistor including a gate electrode, a source electrode, a drain electrode, and an active region;
a sensing thin film transistor on the substrate, the sensing thin film transistor including a gate electrode; a source electrode, a drain electrode; and an active region;
a data line connected to the source electrode of the switching thin film transistor;
a gate line connected to the gate electrode of the switching thin film transistor;
a high power line connected to the drain electrode of the driving thin film transistor;
a reference line connected to the drain electrode of the sensing thin film transistor; and
a sensing line connected to the gate electrode of the sensing thin film transistor.

9. The electroluminescent display apparatus of claim 8, wherein the gate line and the sensing line are provided on the same layer, the data line, the high power line, and the reference line are provided on the same layer, and the gate line is provided upward from the data line, or
wherein the gate line and the sensing line (SL) are provided on the same layer, the data line and the reference line are provided on the same layer, and the data line and the reference line is provided upward from the high power line and downward from the gate line and the sensing line.

10. The electroluminescent display apparatus of claim 8, wherein an upper surface of one end of the gate electrode of the driving thin film transistor contacts a lower surface of the drain electrode of the switching thin film transistor, or
wherein a side surface of one end of the gate electrode of the driving thin film transistor contacts one side surface of the drain electrode of the switching thin film transistor.

11. The electroluminescent display apparatus of claim 1, wherein
the gate electrode comprises a first portion extending in a first direction, and a second portion connected to the first portion to extend in a second direction, with respect to a plan view,
the capacitor electrode comprises a first portion extending in the first direction, and a second portion connected to the first portion of the capacitor electrode to extend in the second direction, with respect to a plan view, and
the first portion of the capacitor electrode faces the first portion of the gate electrode, and the second portion of the gate electrode faces the second portion of the capacitor electrode.

12. The electroluminescent display apparatus of claim 11, wherein
the gate electrode further comprises a third portion connected to the second portion of the gate electrode to extend in a third direction, and a fourth portion connected to the first and third portions of the gate electrode to extend in a fourth direction, with respect to a plan view,
the capacitor electrode comprises a third portion connected to the second portion of the capacitor electrode to extend in the third direction, and a fourth portion connected to the first and third portions of the capacitor electrode to extend in the fourth direction, with respect to a plan view, and
the third portion of the gate electrode faces the third portion of the capacitor electrode, and the fourth portion of the gate electrode faces the fourth portion of the capacitor electrode.

13. The electroluminescent display apparatus of claim 12, wherein the first direction and the third direction each is a lengthwise direction and the same, and the second direction and the fourth direction each is a widthwise direction and the same.

14. An electroluminescent display apparatus comprising:
a substrate; and
a thin film transistor including a gate electrode, a source electrode, a drain electrode, and an active region each provided on the substrate,
wherein
the gate electrode, the source electrode, the drain electrode, and the active region extends in a vertical direction with respect to a surface of the substrate, and
an upper surface of the drain electrode contacts a lower surface of the active region, and a lower surface of the source electrode contacts an upper surface of the active region.

15. The electroluminescent display apparatus of claim 14, further comprising:
a second insulation layer provided between the gate electrode and the active region to extend in the vertical direction with respect to the surface of the substrate,
wherein the gate electrode and the active region face each other with the second insulation layer therebetween.

16. The electroluminescent display apparatus of claim 14, further comprising:
a capacitor electrode extending in the vertical direction with respect to the surface of the substrate; and
a first insulation layer provided between the gate electrode and the capacitor electrode to extend in the vertical direction with respect to the surface of the substrate,
wherein the gate electrode and the capacitor electrode face each other with the first insulation layer therebetween.

17. An electroluminescent display apparatus comprising:
a switching thin film transistor on a substrate, the switching thin film transistor including a first gate electrode, a first source electrode, a first drain electrode, and a first active region;
a driving thin film transistor on the substrate, the driving thin film transistor including a second gate electrode, a second source electrode, a second drain electrode, and a second active region;
a capacitor electrode facing the second gate electrode;
a first electrode electrically connected to the second source electrode;
a light emitting layer on the first electrode; and
a second electrode on the light emitting layer,
wherein the first active region extends in a horizontal direction with respect to a surface of the substrate, and the second active region extends in a vertical direction with respect to the surface of the substrate.

18. The electroluminescent display apparatus of claim 17, further comprising a sensing thin film transistor on the substrate, the sensing thin film transistor including a third gate electrode; a third source electrode, a third drain electrode, and a third active region,
wherein the third active region extends in the horizontal direction with respect to the surface of the substrate.

19. The electroluminescent display apparatus of claim 18, wherein, the first active region and the third active region are provided on the same layer, and
the second active region is provided on a layer differing from the layer of the first active region and the third active region.

20. The electroluminescent display apparatus of claim 18, wherein the first source electrode, the second gate electrode, the capacitor electrode, the second drain electrode, and the third drain electrode extend in the vertical direction with respect to the surface of the substrate.

* * * * *